(12) United States Patent
Hershtig

(10) Patent No.: US 6,664,869 B2
(45) Date of Patent: *Dec. 16, 2003

(54) DELAY LINE FILTERS USING MULTIPLE IN-LINE FOUR-INPUT COUPLERS

(75) Inventor: Rafi Hershtig, Salisburg, MD (US)

(73) Assignee: Delaware Capital Formation, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 10/112,030

(22) Filed: Apr. 1, 2002

(65) Prior Publication Data

US 2002/0153971 A1 Oct. 24, 2002

Related U.S. Application Data

(60) Provisional application No. 06/279,825, filed on Mar. 30, 2001.

(51) Int. Cl.[7] .............................. H01P 9/00; H01P 1/18; H03F 1/00
(52) U.S. Cl. .................. 333/156; 333/161; 333/164; 333/28 R; 330/151
(58) Field of Search ................................. 333/156, 161, 333/164, 28 R; 330/149, 151

(56) References Cited

U.S. PATENT DOCUMENTS

| | | | |
|---|---|---|---|
| 3,277,403 A | 10/1966 | Cohn | 333/28 R |
| 3,699,480 A | 10/1972 | Mueller | 333/28 R |
| 3,836,863 A * | 9/1974 | Seidel | 330/53 |
| 3,942,118 A | 3/1976 | Shiki | 455/314 |
| 4,068,186 A * | 1/1978 | Sato et al. | 330/149 |
| 4,197,514 A | 4/1980 | Kasuga et al. | 333/28 R |
| 4,218,664 A | 8/1980 | Assal et al. | 333/156 |
| 4,409,568 A | 10/1983 | Childs et al. | 333/156 |
| 4,491,808 A | 1/1985 | Saito | 333/28 R |
| 4,622,523 A | 11/1986 | Tang | 333/28 R |
| 4,916,407 A * | 4/1990 | Olver | 330/151 |
| 4,988,962 A | 1/1991 | Janer | 333/28 R |
| 5,119,050 A * | 6/1992 | Upshur et al. | 333/164 |
| 5,252,934 A | 10/1993 | Myer | 333/156 |
| 6,075,412 A * | 6/2000 | Bainvoll | 330/149 |
| 6,335,665 B1 * | 1/2002 | Mendelsohn | 333/139 |

* cited by examiner

Primary Examiner—Barbara Summons
(74) Attorney, Agent, or Firm—Banner & Witcoff Ltd.

(57) ABSTRACT

A delay circuit for the secondary path of a feed-forward high power amplifier is disclosed. A first 3 dB quadrature hybrid coupler is coupled to first and second resonator circuits that are resonant at a first resonant frequency. The output of the first hybrid coupler is coupled to the input of a second 3 dB quadrature hybrid coupler. The second hybrid coupler is coupled to third and fourth resonator circuits that are resonant at a second resonant frequency that is greater than the first resonant frequency. The overall combined delay response of the first hybrid coupler and the second hybrid coupler appearing at the fourth node of the second hybrid coupler is substantially constant between the first resonant frequency and the second resonant frequency.

8 Claims, 39 Drawing Sheets

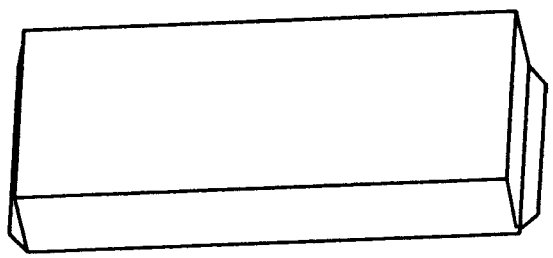

*Fig. 10*

| Filter Characteristics | | | | |
|---|---|---|---|---|
| Freq. Range (MHz)* | Delay (ns)** | Insertion Loss*** (db/ns) | Package Style | LxWxH |
| 2100-2200 | 8-15 ± .25<br>15-20 ± .5 | .40 | series 40 | 1.5"x0.60"x0.4" |
| 1930-1990 | 10-15 ± .25<br>15-20 ± .5 | .40 | series 50 | 1.7"x0.75"x0.4" |
| 1900-2020 | 6-10 ± .25<br>10-15 ± .5 | .40 | series 50 | 1.7"x0.75"x0.4" |
| 869-894 | 10-15 ± .25<br>15-22 ± .5 | .30 | series 60 | 1.9"x0.75"x0.4" |
| 824-919 | 5-10 ± .25<br>10-15 ± .5 | .35 | series 635 | 1.9"x0.75"x0.4" |
| Return Loss | <-20dB | | | |

\* Customized frequency range is available
\*\* Customized delay level is available.
\*\*\* Insertion loss is normalized per ns.
   Example:  Range: 2100-2200MHz / Delay: 13ns
             Insertion loss: 13x.40=5.2dB maximum over temperature

*Fig. 11*

DELAY LINE FILTERS USING MULTIPLE IN-LINE FOUR-INPUT COUPLERS

CROSS-REFERENCE TO RELATED APPLICATION

The present application claims priority to provisional U.S. application Ser. No. 60/279,825, filed Mar. 30, 2001, entitled "Delay Line Filters Using Multiple In-Line Four-Input Couplers", and incorporated by reference herein.

FIELD OF THE INVENTION

The present invention is directed generally to systems and methods for filtering and/or delaying transmission signals, and, more particularly, to systems and methods for providing integrated filters with a flat delay response.

DESCRIPTION OF THE RELATED ART

The popularity of cellular phones and other wireless communication equipment over the last several years has resulted in the need to obtain greater utilization from the existing frequency spectrum while at the same time reducing the cost of technology used to operate at high frequencies. An important component of any cellular system is the high power amplifier that amplifies signals associated with the cellular system. A particular effective high power amplifier is a feed forward design that typically includes one or more delay lines along a main path and one or more delay lines along a secondary feed forward path.

FIG. 1 shows an exemplary feed-forward high power amplifier 1. In this embodiment, the main path includes a hybrid splitter 2, a phase and amplitude adjustment 3, a main amplifier 4, an output coupler 5, a delay line 6, and an error injection coupler 7, feeding output 13. The secondary path in the embodiment shown in FIG. 1 includes a delay line 8, a hybrid combiner 9, phase and amplitude adjustment circuits 10, 11, and an error amplifier 12. The high power amplifier shown in FIG. 1 is suitable for use as a multi-carrier power amplifier.

The delay lines ideally have a uniform, temperature stable, and fixed amount of insertion delay and constant phase over a predetermined frequency range. Conventionally, the delay lines 6 along the main path are implemented using multi-path delay equalization cavity filters. The multi-path delay equalization cavity filters are configured to utilize cross coupling techniques available due to the greater isolation of cavity filters to minimize delay variations across the passband while handling very high levels of power, e.g., in excess of 1,000 watts for most designs, and over 2,000 watts on a custom basis, even for small cavity diameters. Examples of this type of delay line are available from the assignee of the present application as a standard product line. Filters of this type are typically large measuring from around 15 in$^2$ to more than 40 in$^2$.

Other cavity filter delay lines are, for example, shown in U.S. Pat. Nos. 4,622,523 and 3,699,480. Again, these cavity filters are typically used on the main path of the power amplifier shown in FIG. 1.

On the secondary "feed forward" path, the conventional implementation of the delay lines (e.g., delay line 8 in FIG. 1) is a coiled coaxial cable or micro-strip printed on a high dielectric material. Examples of devices falling within this category are shown in U.S. Pat. Nos. 4,409,568, 5,252,934, and 4,218,664 and in conventional components such as Murata LDH33, LDH36, and LDH46 series delay lines. Conventional printed micro-strip delay lines, however, are disadvantageous in that there is coupling between the various turns across the high dielectric material and a high insertion loss. Coaxial cable type delay lines have little cross coupling, but still are characterized by high insertion loss, and require a large amount of area to implement. Accordingly, a suitable secondary delay circuit is not now available conventionally.

Various attempts have been made to achieve delay equalization using active components to shift various delay response curves and add them together. For example, U.S. Pat. No. 3,942,118, issued to Haruo Shiki suggests cascading together a first frequency converter, a first filter, a first series of all-frequency pass filters having successively rising resonant frequencies and successively lowering Q-values (first delay equalizer), a second frequency converter, with a second filter circuit, a local oscillator, and a second series of all-frequency pass filters having successively rising resonant frequencies and successively lowering Q-values (second delay equalizer). This circuit, however, has the disadvantage in that there are large insertion losses, large volume resulting from the large number of components, and temperature instability due to the number of active components. Other attempts at active delay equalization, such as, U.S. Pat. No. 4,491,808, suffer from similar problems.

In 1964, Dr. S. B. Cohn proposed using a four-port coupler or a three-port circulator to achieve equalization of non-linear phase angle or time delay characteristics of other components. See, for example, U.S. Pat. No. 3,277,403, herein incorporated by reference. U.S. Pat. Nos. 4,197,514 and 4,988,962 cite examples of Dr. Cohn's earlier work as prior art in the background portions of the respective specifications. Over the years, there have been several attempts at implementing the structures suggested by S. B. Cohn through the use of bulky, costly, and large devices such as that shown by the above-mentioned U.S. Pat. No. 3,699,480 showing a cavity filter circulator coupled to an impedance circuit. Heretofore, none of these devices has been practical for low cost applications such as the secondary delay line in the multi-carrier power amplifiers discussed in connection with FIG. 1.

Attempts to configure miniaturized implementations using the same designs employed in delay equalized cavity filters have thus far proved unsuccessful due to the cross coupling between the various lumped components of the filter. Heretofore, it was not thought possible to implement such a filter using discrete components.

The lack of shielding in the lumped elements necessarily influences and has a deleterious effect on the overall operation of delay equalization implementations using lumped elements. Conventionally, it was thought that cross coupling in this circuit would result in a device that is nonfunctional for its intended purpose. In the secondary loop, heretofore, it has been thought to be impossible to construct a flat delay response using lumped components configured in a miniaturized configuration because of the numerous stray inductances and the lack of shielding between resonators.

Because of these problems, the present state of the art is to use a coaxial delay line in the secondary path of the feed forward power amplifier. The coaxial delay line in the secondary path, however, has many of the problems discussed above and thus is not satisfactory. Accordingly, the present invention seeks to take an altogether new approach to equalizing the delay across the passband using lumped discrete components. The present invention further seeks to provide improved high and low power delay lines in the main and secondary paths, respectively.

SUMMARY OF THE INVENTION

One goal of one or more aspects of the present invention is a delay circuit that is suitable for the secondary path of a feed-forward high power amplifier. According to one embodiment of the invention, such a delay circuit includes a first and a second 3 dB quadrature hybrid coupler that are each preferably miniaturized. The first 3 dB quadrature hybrid coupler has a first node that receives an input signal, a second node that is coupled to a first resonator circuit, a third node that is coupled to a second resonator circuit and a fourth node that is an output node. The first and second resonators are each preferably an inductive-capacitive resonator circuit, and are resonant at a first resonant frequency. The delay response of the first 3 dB quadrature hybrid coupler as a function of frequency is substantially linearly decreasing for increasing frequency greater than the first resonant frequency. The second 3 dB quadrature hybrid coupler has a first node coupled to the fourth node of the first 3 dB quadrature hybrid coupler, a second node that is coupled to a third resonator circuit, a third node that is coupled to a fourth resonator circuit, and a fourth node that is an output node. The third and fourth resonators resonator circuit are each preferably an inductive-capacitive resonator circuit, and are resonant at a second resonant frequency, such that the second resonant frequency is greater than the first resonant frequency. The delay response of the second 3 dB quadrature hybrid coupler as a function a frequency is substantially linearly decreasing for increasing frequency less than the second resonant frequency. The overall combined delay response of the first 3 dB quadrature hybrid coupler and the second 3 dB quadrature hybrid coupler appearing at the fourth node of the second 3 dB quadrature hybrid coupler is substantially constant between the first resonant frequency and the second resonant frequency.

According to another embodiment of the invention, such a delay circuit includes a third 3 dB quadrature hybrid coupler having a first node connected to the fourth node of the first 3 dB quadrature hybrid coupler, a second node that is coupled to a fifth resonator circuit, a third node that is coupled to a sixth resonator circuit and a fourth node that is connected to the first node of the second 3 dB quadrature hybrid coupler. The fifth and sixth resonator circuits are resonant at a third resonant frequency. The third resonant frequency is greater than the first resonant frequency and less than the second resonant frequency. The overall combined delay response of the first 3 dB quadrature hybrid coupler, the second 3 dB quadrature hybrid coupler and the third 3 dB quadrature hybrid coupler appearing at the fourth node of the second 3 dB quadrature hybrid coupler is substantially less than about 10 ns between the first resonant frequency and the second resonant frequency.

Another goal of one or more aspects of the invention is to define a lumped element delay line that has a flat delay characteristic over the passband in a similar manner to how the cavity delay line has a relatively flat delay characteristic over the passband. The present invention utilizes a new configuration for lumped elements previously thought not to be practical in a miniaturized structure. The new architecture utilizes conventional theories to provide a highly improved structure for delay equalization using lumped components to form a flat delay response. This is particularly useful in the secondary feed forward path of the linear amplifier.

One or more aspects of the present invention may solve one or more of the above problems and/or provide improved techniques for implementing delay lines using lumped components.

In one aspect of the invention, a miniaturized delay line assembly is configured using lumped components comprising a miniaturized 3 dB quadrature hybrid coupler (having resonators using lumped components) coupled to two ports and connected in series with a discrete implementation of a band pass filter.

In another aspect of the invention, the lumped components are tuned and mounted in a metal canister prior to shipping to a customer in order to provide the proper equalization. Proper equalization is difficult to achieve using the tolerances normally associated with printed circuit boards assembled on a production basis. In this manner, the delay line may be provided as a pre-assembled part to various manufacturers, such as for use in the secondary path of power amplifiers.

In still another aspect of the invention, a miniaturized four port hybrid quadrature coupler is configured with discrete L-C resonators as the lumped components at two ports coupled in series with a filter, preferably a bandpass filter itself formed from lumped components. In still further aspects of the invention, the miniaturized 3 dB quadrature hybrid coupler is mounted to the same circuit board as the filter with the resonators mounted in close proximity to the miniaturized 3 dB quadrature hybrid coupler, e.g., within ½ inch and more preferably within ¼ inch.

In still further aspects of the invention, the resonator components are discrete components mounted on the miniaturized 3 dB quadrature hybrid coupler. In yet further aspects of the invention, the resonator components are mounted on top of the miniaturized 3 dB quadrature hybrid coupler.

In still further embodiments of the invention, the filter is implemented using miniature ceramic resonators such as the KEL-FIL® class of ceramic filters.

In yet further aspects of the invention, there is described a method of manufacturing the delay lines such that pre-tested filters are distributed to the field.

In other aspects of the invention, multiply delay circuits are included along with a filter circuit.

In still more aspects of the invention, the delay gain of the circuit is split between the delay circuits and the filter circuits such that the delay circuits comprise 60% or less of the total delay and preferably 50% or less of the total delay and most preferably about 40% of the total delay.

Further aspects of the invention provide for:

In a cavity filter having a plurality of resonators, a capacitive probe providing coupling between a pair of resonators having an odd number of resonators in a signal path there between. The pair of resonators may preferably include a resonator disposed at a turn in the signal path.

A cavity delay arrangement utilizing mixed capacitive and inductive coupling between at least some of a plurality of resonators.

A high power stripline or microstrip three dB hybrid quadrature 90-degree phase shift multicoupler loaded by resonators. An all-pole Chebychev filter may be cascaded with the high power multicoupler.

A pre-tuned delay line module. The module may be used as either a main delay line or a secondary delay line in a feed-forward high-power amplifier.

These and other features of the invention will be apparent upon consideration of the following detailed description of preferred embodiments. Although the invention has been defined using the appended claims, these claims are exemplary in that one or more aspects of the invention are intended to include the elements and steps described herein in any combination or subcombination. For example, it is intended that each of the above aspects of the invention may be used individually and/or in combination with one or more other aspects of the invention defined above and/or in connection with the detailed description below. Accordingly, there are any number of alternative combinations for defining the invention, which incorporate one or more elements from the specification, including the description, claims, aspects of the invention, and/or drawings, in various combinations or subcombinations. Moreover, it will be apparent to those skilled in microwave theory and design, in light of the present specification, that alternate combinations and subcombinations of one or more aspects of the present invention, either alone or in combination with one or more elements and/or steps defined herein, may constitute alternate aspects of the invention. It is intended that the written description of the invention contained herein cover all such modifications and alterations.

BRIEF DESCRIPTION OF THE DRAWINGS

The foregoing summary of the invention, as well as the following detailed description of preferred embodiments, is better understood when read in conjunction with the accompanying drawings, which are included by the way of example, and not by way of limitation with regard to the claimed invention.

FIG. 10 shows a preferred packaging of embodiments of the invention.

FIG. 11 shows typical operating characteristics of embodiments of the invention.

FIGS. 31A–32A are top plan views of an exemplary embodiment of a stripline 3 dB hybrid quadrature 90 degree phase shift multicoupler loaded by two identical resonators, leaving the device with one input and one output, according to aspects of the present invention.

DETAILED DESCRIPTION OF PREFERRED EMBODIMENTS

Low Power Delay Line

Figure 2:
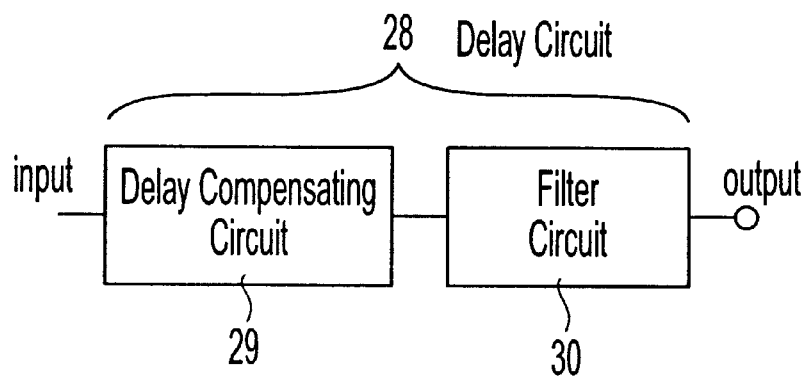
FIG. 2 is a block diagram in accordance with an embodiment of the invention.

Referring to FIG. 2, a delay circuit 28 may be variously configured to include a delay compensating circuit 29 coupled in series with a filter circuit 30.

Figure 3:
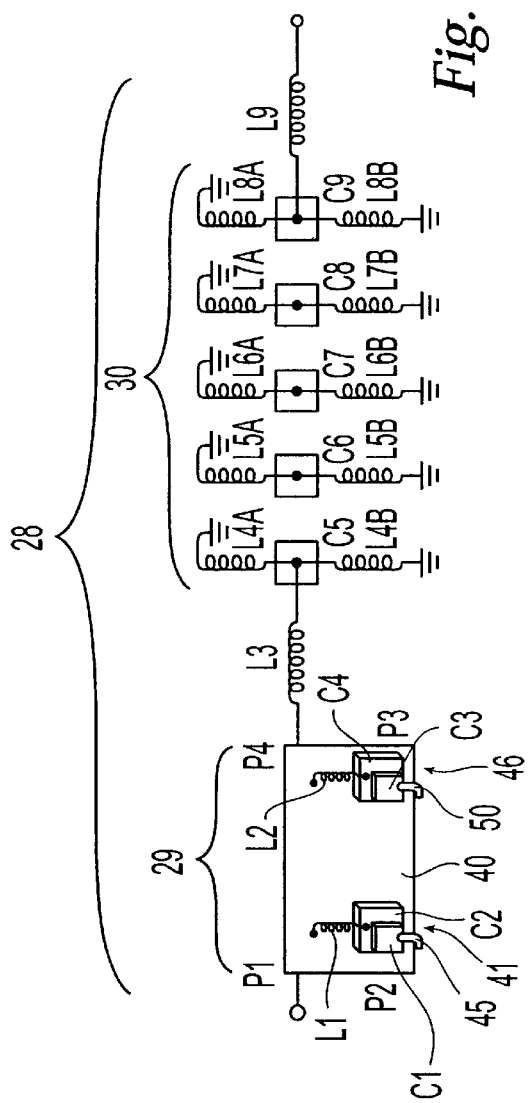
FIG. 3 is a partial pictorial/partial schematic view of the first exemplary embodiment of the invention.
Figure 4:
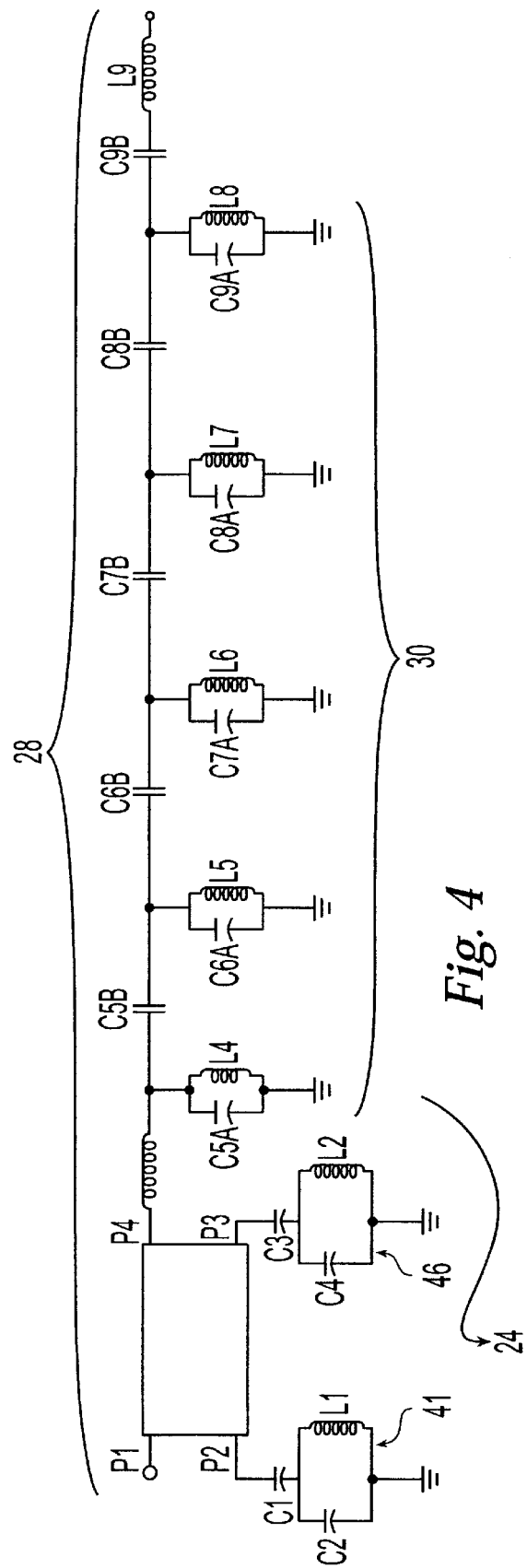
FIG. 4 is a schematic diagram of the embodiment shown in FIG. 3.
Figure 5:
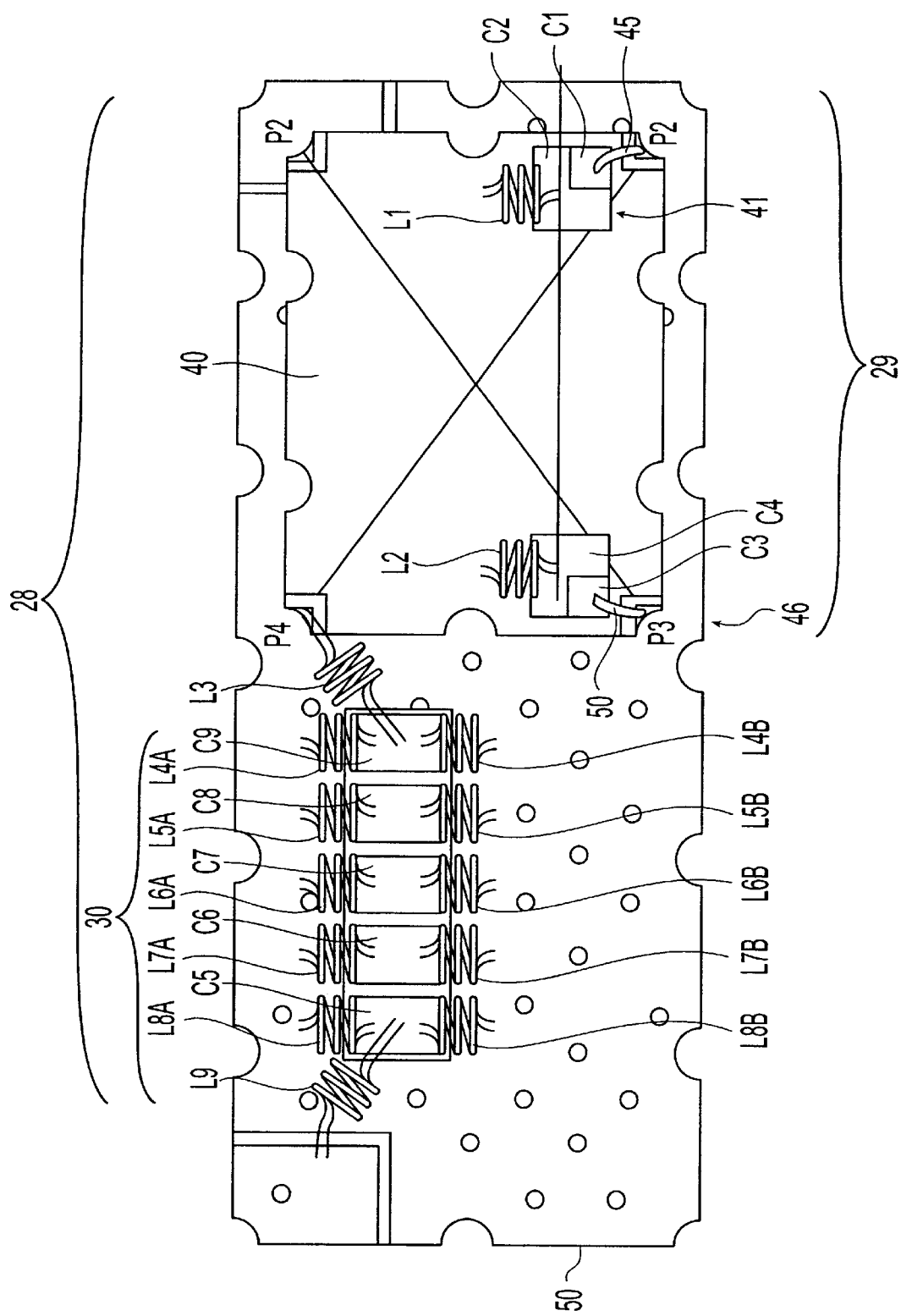
FIG. 5 is a top view of a completed circuit board in accordance the first exemplary embodiment of the invention.

FIG. 3 shows a partial pictorial and partial schematic view of a first exemplary embodiment of the invention. FIG. 4 shows a schematic view of the first exemplary embodiment of the invention shown in FIG. 3. FIG. 5 shows a top view of a circuit card containing the first exemplary embodiment of the invention.

Figure 12A:
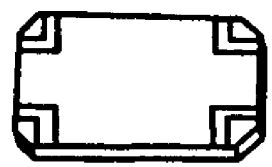
FIGS. 12A and 12B show a pictorial view of exemplary miniaturized 3 dB quadrature hybrid coupler.
Figure 12B:
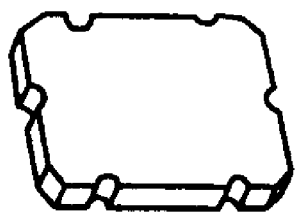

FIGS. 3–5 all utilize a miniaturized 3 dB quadrature hybrid coupler that was previously thought not to be possible for use in delay equalization circuits with lumped elements because the small size of these couplers conventionally was thought to result in prohibitive cross-coupling problems when used with lumped elements. FIGS. 12A and 12A show pictorial representations of two exemplary miniaturized 3 dB quadrature hybrid couplers. As shown in FIG. 11, the miniaturized 3 dB quadrature hybrid coupler 40 typically has a volume of less than about 0.03 in$^3$ for high power devices (e.g., 100–200 W) and about 0.01 in$^3$ for standard power devices (e.g., about 60 watts). In accordance with embodiments of the present invention, suitable miniaturize 3 dB quadrature hybrid couplers are typically formed using hybrid microstrip technology, hybrid multilayer technology, or an integrated circuit technology such as chip monolithic implementations. Typically, the miniaturized 3 dB quadrature hybrid couplers formed with hybrid multilayer technology and hybrid microstrip technology are formed using, for example, ceramic filled PTFE composites or other materials compatible with typical expansion characteristics of circuit boards formed from common substrate materials such as FR4, G-10, and polyamide. In one preferred embodiment, a Xinger, produced by Anaren, part number 1A1306, available at Anaren.com, Anaren Microwave, Inc., 6635 Kirkville Road, East Syracuse, N.Y. 13057 may be utilized. Other examples of miniaturized 3 dB quadrature hybrid couplers include models made by Mid-Atlantic RF Systems Inc., P.O. Box, 745, Forest Hill, Md. 21050; EMC Technology LLC, 1971 Old Cuthbert Road, Cherry Hill, N.J. 08034; and RF Power Components, Inc., 125 Wilbur Place, Bohemia, N.Y. 11716; muRata, 2200 Lake Park Drive Smyrna, Ga. 30080-7604. The miniaturized 3 dB quadrature hybrid coupler, shown in FIG. 12 or 13, may be utilized as the miniaturized 3 dB quadrature hybrid coupler 40 shown in FIGS. 3–6.

Referring again to FIGS. 3–5, a miniaturized 3 dB quadrature hybrid coupler 40 has an input coupled to node P1, an output coupled to P4, and resonators coupled to P2 and P3. The resonator 41 comprises micro inductor L1, capacitors C1, C2, and coupling strap 45. The resonator 46 comprises micro inductor L2, capacitors C3, C4, and coupling strap 50. The resonators are preferably mounted close to the miniaturized 3 dB quadrature hybrid coupler 40, e.g., within one inch, and more preferably within ½ inch, and even more preferably within ¼ inch. The mounting of the resonators in close proximity to the miniaturized 3 dB quadrature hybrid coupler 40 decreases the variances caused by the coupling straps 45, 50, decreases cross coupling, and increases the ease of tuning of the resonators. In one preferred embodiment, space may be minimized by locating the miniaturized 3 dB quadrature hybrid coupler 40 over or under the resonators. In this manner, the area required by the 3 dB quadrature hybrid coupler 40/resonators combination may be minimized while also minimizing the length of the straps 45, 50. In one exemplary embodiment, the resonators are disposed on top of and physically coupled to the miniaturized 3 dB quadrature hybrid couplers. In this manner, the miniaturized 3 dB quadrature hybrid couplers may be utilized to support and electrically isolate the resonators, increasing tuning ease and reducing cross coupling. An example of the resonators disposed on and supported by the miniaturized 3 dB quadrature hybrid couplers is shown in FIGS. 3 and 5.

In alternate embodiments of the invention, the miniaturized 3 dB quadrature hybrid coupler may be customized to include some or all of the resonators 41, 46. For example where only a predetermined array of frequency ranges is required, the resonators may be completely integrated into the miniaturized 3 dB quadrature hybrid coupler. This allows the entire delay compensating circuit to be manufactured on a production line for high volume, low cost applications. For some semi-custom applications, one or more of the capacitors may be integrated into the miniaturized 3 dB quadrature hybrid coupler. In these embodiments, the miniaturized 3 dB quadrature hybrid coupler include capacitors C1, C2, C3, and/or C4 formed integrally with the miniaturized 3 dB quadrature hybrid coupler.

In cases where it is desirable to tune the resonators using either the straps 41, 46, the capacitors C1–C4, and/or the micro inductors L1, L2, it is desirable to leave one or more of these components such that they are easily modified. By leaving one or more of these components exposed, the delay compensating circuit 29 may be tuned to a particular frequency, e.g., by manually tuning the resonators 41, 46. Thus, the devices are suitable for manufacture in low-volume, high mix environments. In one preferred embodiment, the resonators are soldered together and to the top of the miniaturized 3 dB quadrature hybrid coupler 40. This arrangement provides greater reliability, reduced cross-coupling and smaller area. Further, the capacitors may be easily interchanged to provide maximum flexibility for custom applications (e.g., low volume, high mix applications).

FIG. 5 shows one exemplary embodiment of the miniaturized 3 dB quadrature hybrid coupler 40 mounted on a circuit card 50. The drawing shown in FIG. 5 is three times actual size. The exact overall packaged dimensions of the exemplary delay circuits 28 are specified in FIG. 11.

Again referring to FIGS. 3–5, delay-compensating circuit 29 may be coupled to filter 30 as described above in connection with FIG. 2. The filter 30 may be disposed remote from the delay compensating circuit 29 or disposed proximate the delay compensating circuit 29. In many applications, it is desirable to mount the filter 30 close to the delay compensating circuit such as less than one inch, preferably less than ½ inch and more preferably less than ¼ inch. In the most preferred embodiments, the filter 30 is mounted directly adjacent to the delay compensating circuit and co-located in the same housing (e.g., the housing shown in FIG. 10) and/or mounted on the same circuit board (e.g., circuit board 50 shown in FIG. 5). Co-locating the delay compensating circuit 29 with the filter 30 has the advantage of protecting both circuits from cross coupling with other circuits, e.g., other elements in a feed forward amplifier. Additionally, the delay characteristics of both the filter 30 and the delay compensating circuit 29 can be closely controlled and matched. Additionally, an integrated assembly can be tested, tuned, and provided with proper quality assurance prior to being delivered. Often it is difficult to achieve an acceptable level of repeatability in a production environment for sensitive high frequency microwave applications, particularly where the delay circuit is integrated directly into a much larger circuit card. The pre-packaging of this circuit solves this problem.

Again returning to FIGS. 3–5, the filter 30 may be formed of any suitable lumped element components, e.g., micro dielectric resonators such as ceramic elements, or combined resistive, inductive, and/or capacitive elements. In the embodiment shown in FIGS. 3–5, the filter 30 is formed from co-located capacitors formed from lines of the circuit board with discrete micro inductors soldered between the capacitors and ground. The micro resonators are preferred because, in the disclosed embodiment, cross coupling can be minimized. As shown in FIGS. 3 and 5, the capacitors C5–C9 may be formed as square traces disposed on a circuit card and co-located to provide capacitive coupling to each other and ground. Schematically, the capacitors C5–C9 are shown in FIG. 4 as C5A, C5B, C6A, C6B, C7A, C7B, C8A, C8B, and C9A, C9B. The filter 30 may also be configured to include one or more inductors such as micro-inductors L3, L4A, L4B, L5A, L5B, L6A, L6B, L7A, L7B, L8A, L8B, and L9 as shown in FIGS. 3 and 5. The micro inductors are shown schematically in FIG. 4 as inductors L3–L9.

The circuit of FIGS. 3–5 may be configured to provide a flat delay response for any suitable filter, such as a band-pass filter. For example, by utilizing the delay compensating circuitry 29, coupled to the filter 30, the overall delay circuit 28 may exhibit, for example, only a minimal delay variation of 250 ps (0.25 nanoseconds) over the operational range of the linear amplifier i.e., the over the preferred bandwidth. Accordingly, it is possible with delay equalization to provide a precise delay element using lumped components that exhibits a flat delay response over of the appropriate bandwidth. This was previously thought not to be possible at high frequencies using miniaturized components due to cross coupling between the components. Surprisingly, however, it has been found that the miniaturized lumped elements may be configured to provide excellent delay elements for high frequency communications in the disclosed configurations. This results in a major cost savings over conventional configurations that heretofore have utilized bulky and costly cavity filters, microstrips, and/or coaxial delay lines to accomplish the delay function. Circuits in accordance with the present invention are particularly useful in the feed forward path of a feed forward amplifier.

The operation of FIGS. 3–5 will now be described. Signals input into port 1 of the miniaturized 3 dB quadrature hybrid coupler are split into two signals into ports two and three with each signal having a −3 dB loss. The signal output at port 3 is −180° out of phase and the signal output at port two is −90° out of phase. Accordingly, the difference between the port 2 signal and the port 3 signal is a 90° phase shift, with the port 2 signal being shifted −90° and the port 3 signal being shifted −180°.

Again referring to FIGS. 3–5, a signal entering the miniaturized 3 dB quadrature hybrid coupler at node 1, progresses to node 2 (90° out of phase), is reflected back via resonator 41, travels from node 2 to node 1 (180° out of phase), travels from node 1 to node 4 and is 270 degrees out of phase at node 4. The signal entering at node 1 of the miniaturized 3 dB quadrature hybrid coupler also travels from node 1 to node 4 (90° out of phase), from node 4 to node 3 (180° out of phase), is reflected back via resonator 46, passes from node 3 to node 4 and is 270° out of phase at node 4. Thus, the signals reflected back from both resonators 41 and 46 are both 270° out of phase at node 4 and additively combine to form the delay signal shown as curve B in FIG. 7. Because the signals are in-phase at node 4, the only losses through the miniaturized 3 dB quadrature hybrid coupler are the losses associated with the extremely low impedance of the coupler itself, e.g., on the order of 0.3–0.4 dB or less per nanosecond. In exemplary embodiments, the insertion loss may be further reduced by selection of appropriate coupling components to be 0.25 dB or less, 0.20 dB or less, 0.15 dB or less, and/or 0.13 dB or less per nanosecond. A reduction in the insertion loss has the advantage in that more power is output from the delay circuit 28. This is advantageous over other delay circuit implementations that have high insertion losses per volume ratios.

In still further exemplary embodiments, the power handling capabilities of the circuit may be variously configured by selection of appropriate components. For example, the delay circuit may be configured to handle, 25, 30, 35, 45, 65, 75, 100, or 200 or more watts. For example, by utilizing a high power miniaturized 3 dB quadrature hybrid coupler from RF Power Components, Inc. (discussed above), the delay circuit 28 may be configured to handle 200 or more watts while still maintaining the compact size and low cost associated with embodiments of the present invention. Embodiments of the invention employing high power, low insertion loss, and compact size open entire new applications for the invention such as for use in the main path of some low power feed forward amplifiers.

Still referring to FIGS. 3–5, the delay through the coupling circuit as it enters and exits the resonators 41, 46 is such that it forms an inverse parabola as follows: the delay in the frequency at resonance enters the resonator, is reflected within the resonator several times and then is reflected back out. Signals entering resonators 41, 46 are delayed within the resonance frequency range of the resonators while signals outside of the resonant frequency range are immediately reflected. In other words, signals that lie outside of the resonance frequency range are bounced back immediately while signals within the resonance frequency range are circulated within the resonator. Thus, for frequencies increasingly further away from the center resonance frequency, the reflection is immediate and not delayed. Therefore, the delay path at resonance is much longer than for frequencies outside of the resonance. This results in a delay characteristic as shown in curve B in FIG. 7. As with the filter, the center frequency and shape of the inverted parabola (curve B in FIG. 7) may be modified by selectively choosing reactive elements and configurations of resonator 41, 46. In this manner, the characteristics and shape of curve B may be modified to closely compensate for the delay response of filter 30.

The delay compensating circuit 29 may be configured to provide a matched impedance of 50 Ohms and a flat transmission loss over the bandwidth. In many applications, it is desirable to configure the miniaturized 3 dB quadrature hybrid coupler to 50 Ohms over the bandwidth so that all frequencies are transmitted freely into the miniaturized 3 dB quadrature hybrid coupler. The miniaturized 3 dB quadrature hybrid coupler is desirable in many applications over coupling arrangements because it has been found to provide a superior flat amplitude response such that some frequencies are not preferred over others. This provides superior performance characteristics for the overall delay circuit 28.

Figure 7:
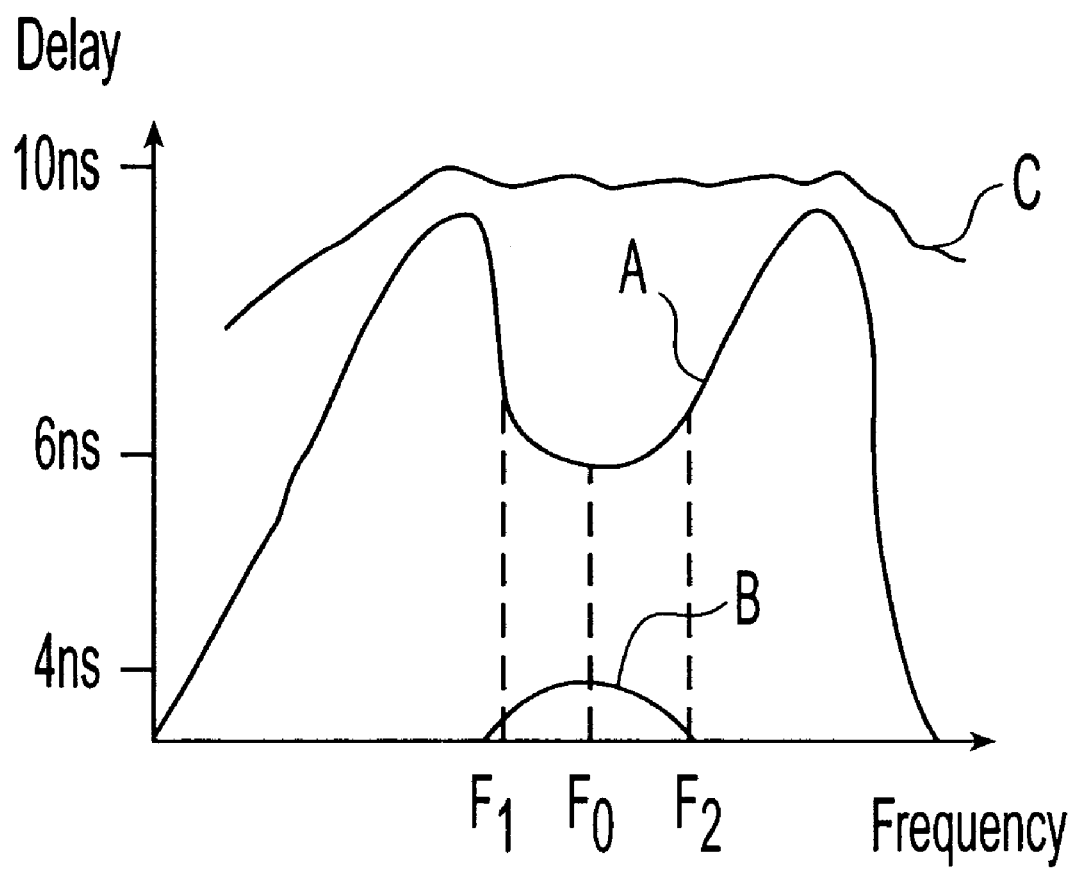
FIG. 7 is a frequency versus delay chart showing the operation of embodiments of the invention.

Referring to FIG. 7 in more detail, curve C represents the output of an exemplary delay circuit 28 in accordance with embodiments of the invention. The delay circuit 28 may exhibit small oscillations in the passband (e.g., on the order of about a quarter of a nanosecond of delay deviation) with the overall delay determined based on the value of the components selected. In the embodiment shown in FIG. 7, the overall delay is about 10 ns. Curve A indicates the unequalized normal filter response of a bandpass filter as, for example, the bandpass filter 30 shown in FIGS. 3–5. The normal unequalized response of the bandpass filter may be compensated by a delay compensation circuit 29 (e.g., as shown in FIGS. 3–5) to compensate for the delay variations in the normal bandpass filter response. The delay compensation circuit may be coupled serially with the filter as discussed above. The delay compensation circuit may have a frequency response that has a delay characteristic opposite the accompanying filter, e.g., an inverted parabola as shown in curve B in FIG. 7. The addition of the normal filter response, curve A, with the inverted parabola response, curve B, results in the flat delay response, curve C, having some minor oscillations.

Figure 8:
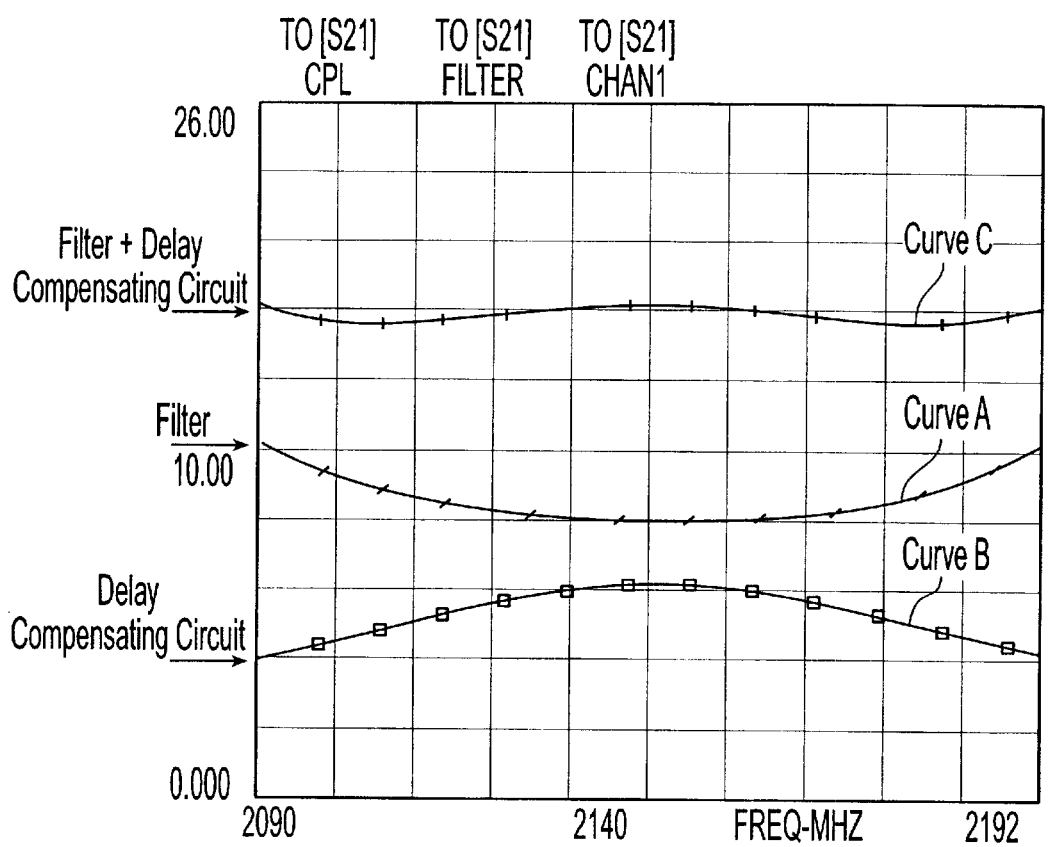
FIG. 8 is a frequency versus delay chart of the operation of other embodiments of the invention.

FIG. 8 shows a second exemplary plot of a delay response curve in accordance with embodiments of the present invention. As shown in FIG. 8, the delay compensating circuit 29 represents a contribution to the overall delay of between 4 ns and approximately just slightly over 6 ns over the desired bandwidth, with an average delay of 5 ns. The filter circuit 30 represents a delay contribution of between 8 and just over 10 ns over the desired bandwidth, with an average delay of 9 ns. Curve C represents the output of the overall delay circuit 28 showing an average delay of 14 ns with a delay variation of less than 0.25 ns over the desired bandwidth. The relative proportion of the overall delay (curve C) attributable to the delay circuit is such that the overall delay is split between the delay circuit and the filter circuit in a predetermined amount. It has been found that the minimum delay deviation may be achieved where the delay circuit comprises 60% or less of the overall delay, and preferably 50% or less of the total delay and most preferably about 40% of the total delay. In the exemplary circuit illustrated by the plot in FIG. 8, the delay circuit provides about 36% of the overall delay associated with the delay circuit 28.

Figure 6:
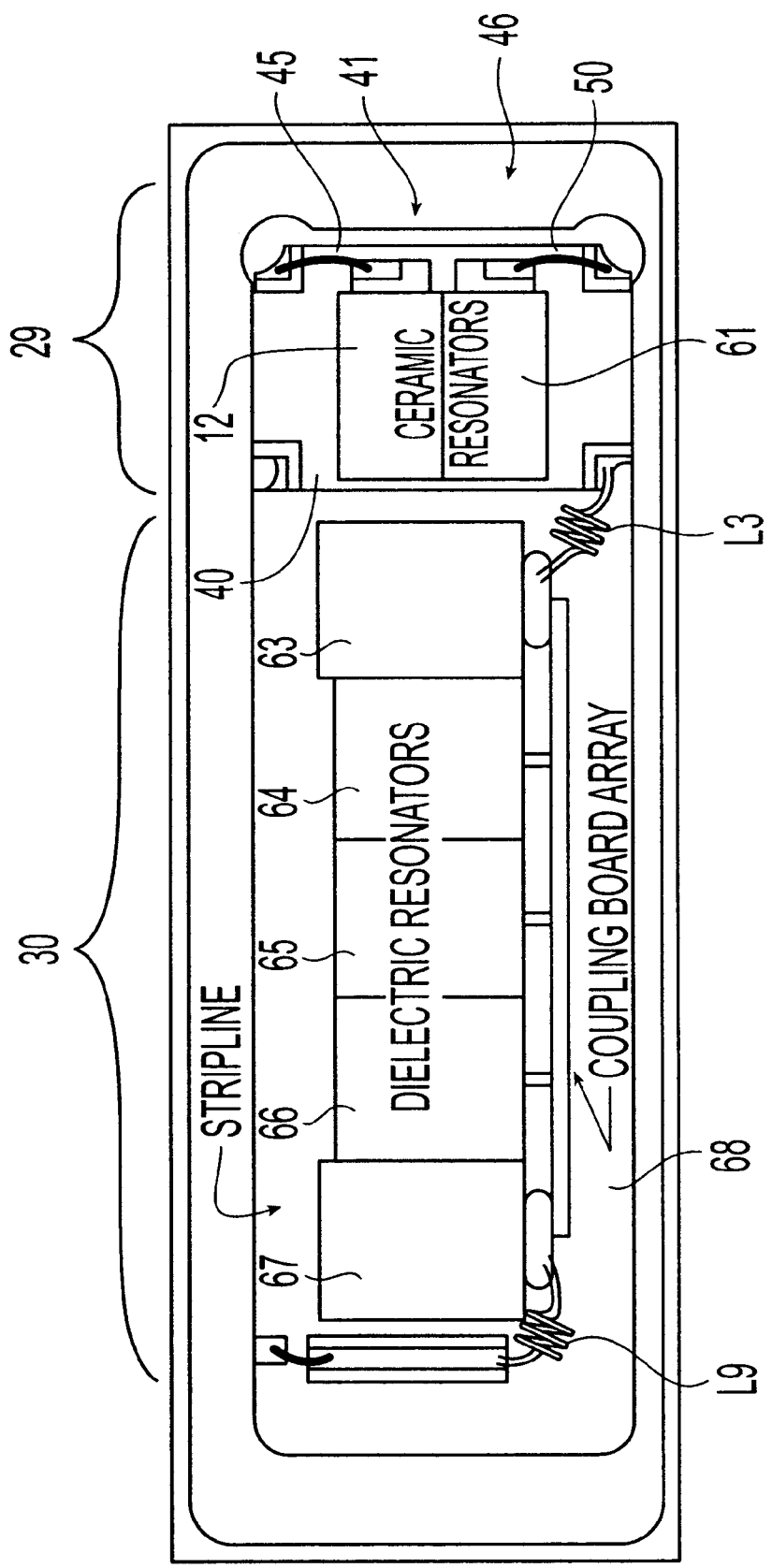
FIG. 6 is a top view of a completed circuit board in accordance with a second exemplary embodiment of the invention.

FIG. 6 shows a second exemplary embodiment delay circuit 28 configured in a similar manner as the circuits of FIGS. 3–5 with the exception that KEL FIL™ resonator components (miniaturized ceramic/dielectric resonators) are utilized to form the filter and the resonators, but is otherwise similar to FIGS. 3–5. Referring specifically to FIG. 6, the ceramic resonator 61 is utilized to form resonator 46 while the ceramic resonator 62 is utilized to form resonator 41. The ceramic resonators 61, 62, may be mounted in close proximity to (e.g., adjacent to or on) the miniaturized 3 dB quadrature hybrid coupler as discussed above with respect to resonators 41, 46. Again referring specifically to FIG. 6, the filter 30 may similarly be configured using miniaturized ceramic resonators 63–67 in place of filter stages L4C5, L5C6, L6C7, L7C8, L8C9 respectively. In the embodiment of FIG. 6, the circuit board 50 may be used to form coupling board array 68 or in addition to coupling board array 68. In some embodiments, it may be desirable to utilize a standard KEL FIL™ filter supplied by K&L Microwave, Incorporated, 2250 Northwood Drive, Salisbury Md. 21801.

Figure 9:
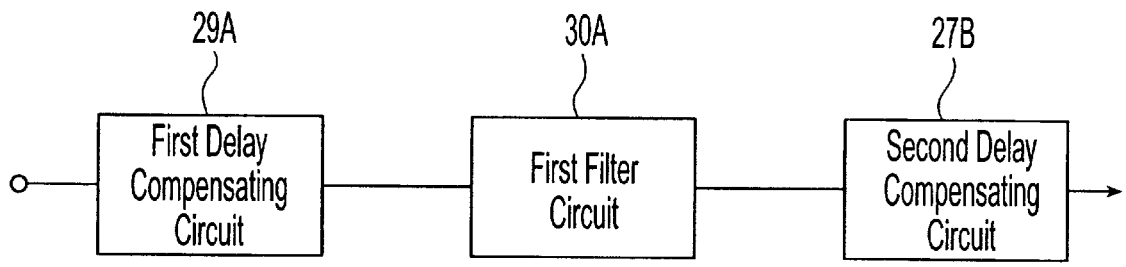
FIG. 9 shows additional embodiments of the invention.

The general block diagram shown in FIG. 2 may be alternately configured to include any number of delay compensating circuits 29 and/or filter circuits 30. For example, referring to FIG. 9, one or more delay compensating circuits 29 (e.g., first 29A, second 29B, and/or third delay 29C (not shown) compensating circuits may be coupled in series with one or more filter circuits 30 (e.g., first 30A, second 30B (not shown), and/or third 30B (not shown) filter circuits). In alternate embodiments, the delay compensating circuit 29 may be positioned either before or after the filter circuit 30. Where more than one delay compensating circuit is utilized in series with a single filter circuit, the filter circuit may be positioned before, after, or between (as shown in FIG. 9) the delay compensating circuits. Where multiple filters are utilized in series with multiple delay compensating circuits, the filters may be located before, after, and/or interspersed with the delay compensating circuits. The concatenation of multiple delay compensating circuits with one or more filter circuits enables the oscillations shown in FIGS. 7 and 8 to be reduced over the target bandwidth and/or allows the target bandwidth to be expanded.

Figure 1:
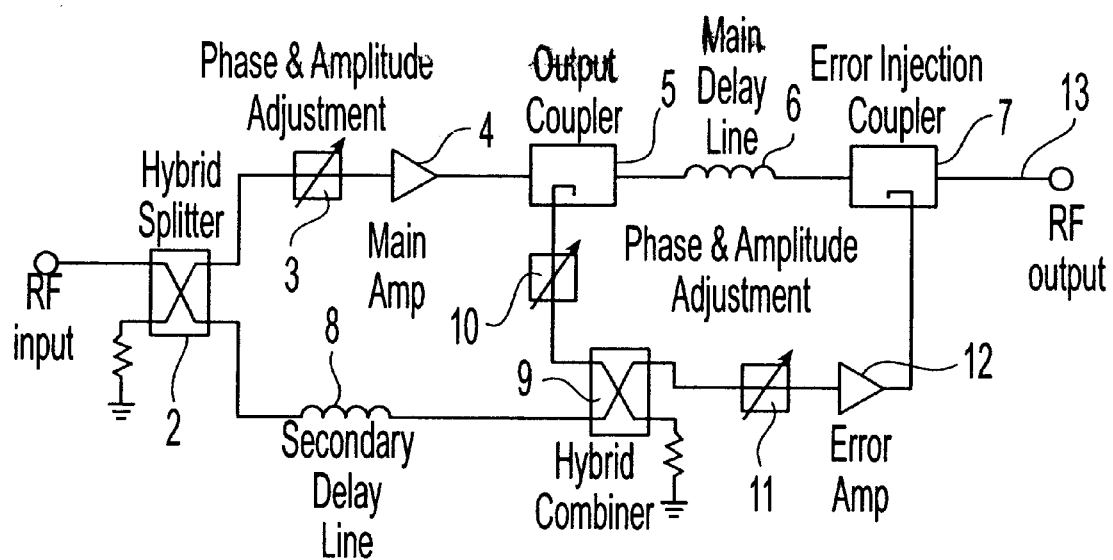
FIG. 1 is a block diagram of one exemplary embodiment of an amplifier having a feed forward design.

FIG. 10 is a pictorial view of the metal case encompassing the delay circuit 28 including both the delay compensating circuit 29 and the filter circuit 30. The metal case is advantageous in that it isolates the delay circuit 28 from other extraneous electromagnetic interference. Thus, the delay circuit 28 may be shipped as a tested, tuned, and mounting ready unit for operation in any application requiring a delay circuit 28 without the need for special electromagnetic engineering on the circuit card containing the delay circuit. Thus, the overall ease of design and reliability of various feed forward amplifiers is increased because the lumped element delay circuit comprising the miniaturized 3 dB quadrature hybrid coupler may be pretested and assembled prior to mounting on a main board containing other elements such as the remaining components of a feed forward amplifier as shown in FIG. 1.

Delay circuits may be formed using various methods. For example, in one exemplary assembly method, the delay circuit may be assembled by mounting on a circuit board at least a first miniaturized 3 dB quadrature hybrid coupler using known techniques such as a surface mount connection. A plurality of first micro inductors and micro capacitors may also be coupled to the circuit board using known techniques, e.g., surface mounting. The plurality of first micro inductors and micro capacitors may be configured to form one or more resonators, e.g., first and second resonators respectively coupled to at least two ports of the miniaturized 3 dB quadrature hybrid coupler. A plurality of second micro inductors and capacitors may be configured to form a filter. The filter may utilize either discrete micro capacitors and/or micro capacitors from directly from traces on the circuit board. Where capacitors are formed directly from traces on the circuit board, manufacturing costs may be substantially reduced while sizing and ease of tuning are substantially increased. Surface mount couplers are conducive to conventional reflow methods such as (IR, Vapor Phase, Wave Solder, Manual Hot Air).

In a second exemplary method delay circuits may be formed using various methods. For example, in one exemplary assembly method, the delay circuit may be assembled by mounting on a circuit board at least a first miniaturized 3 dB quadrature hybrid coupler using known techniques such as a surface mount connection. A plurality of first micro inductors and micro capacitors may also be coupled to the circuit board using known techniques, e.g., surface mounting. The plurality of first micro inductors and micro capacitors may be configured to form one or more resonators, e.g., first and second resonators respectively coupled to at least two ports of the miniaturized 3 dB quadrature hybrid coupler. A plurality of second micro inductors and capacitors may be configured to form a filter. The filter may utilize either discrete micro capacitors and/or micro capacitors from directly from traces on the circuit board. Where capacitors are formed directly from traces on the circuit board, manufacturing costs may be substantially reduced while sizing and ease of tuning are substantially increased.

FIG. 11 provides a table showing exemplary performance characteristics for the delay circuit 28 including the delay compensating circuit 29 and the filter circuit 30.

As discussed above, FIGS. 12A and 12B show exemplary embodiments of various commercially available miniaturized 3 dB quadrature hybrid couplers for use with embodiments of the present invention.

High Power Delay Line

As discussed above with respect to FIG. 1, the high power amplifier 1 typically includes the main delay line 6. These types of filters are well-known, such as is shown by U.S. Pat. No. 5,739,733 to Cameron, issued Apr. 14, 1998, and U.S. Pat. No. 4,216,448 to Kasuga et al., issued Aug. 5, 1980. A problem arises, however, in that these filters do not have sufficiently flat delay response. Accordingly, an improved high power delay line filter is needed.

Figure 14:
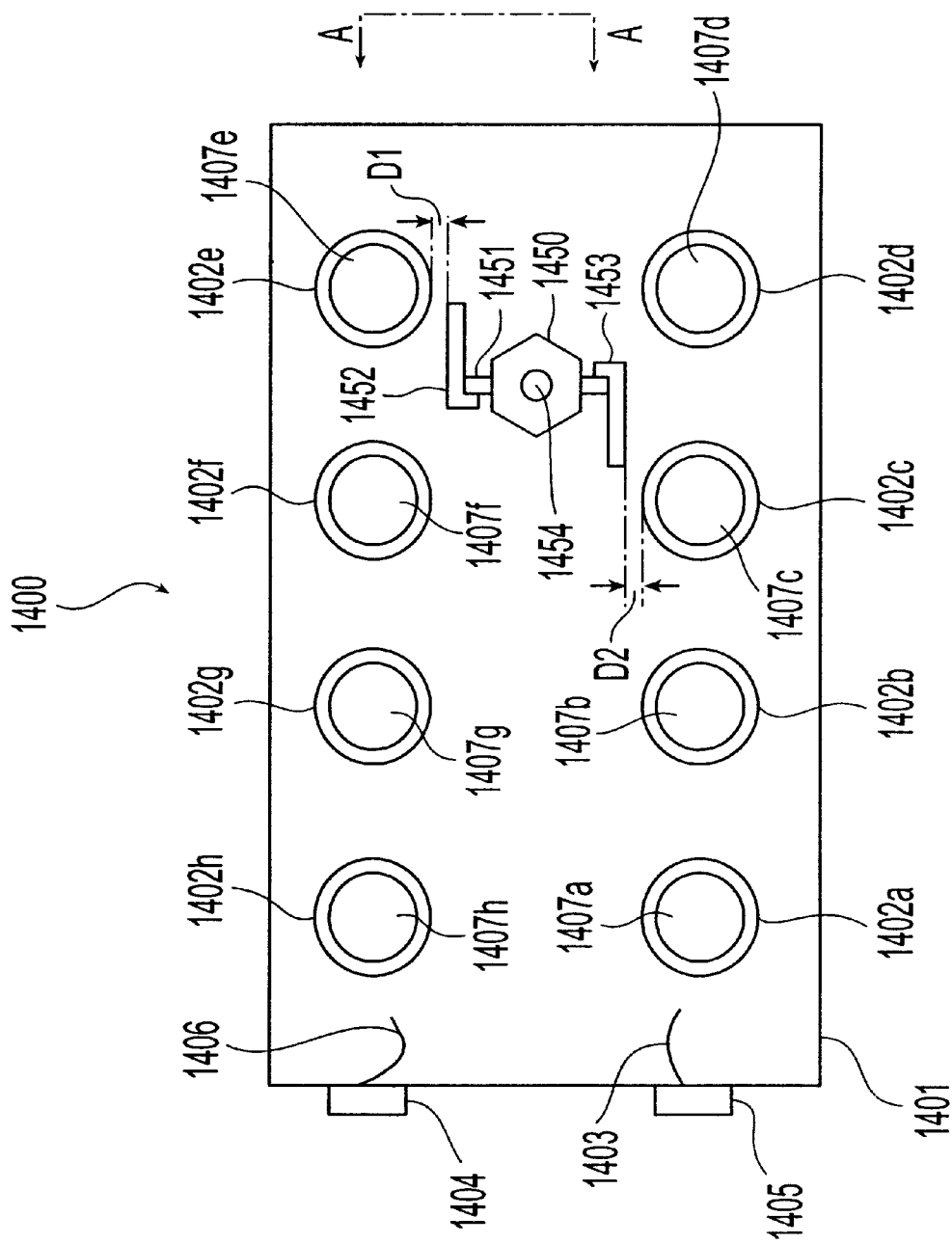
FIGS. 14–18 are plan views of filters having various exemplary embodiments of capacitive probes according to aspects of the present invention.

A first exemplary embodiment of the main delay line 6 is shown in FIG. 14 as delay arrangement 1400. The delay arrangement 1400 may have a housing 1401 and/or a lid (not shown in FIG. 14) that may be screwed down and secured to the housing 1401. The housing 1401 and/or the lid may preferably be partially or completely made of a conductive material such as aluminum.

The delay arrangement 1400 may further have a plurality of inductively-coupled resonators 1402a–1402h, each of which may be disposed in the housing 1401. Although eight resonators are shown, any number of resonators may be used, e.g., four to 16 resonators, including any increment between these ranges. In certain embodiments, more than 16 resonators may be utilized. The resonators 1402a–1402h may be partially or completely made of a conductive material such as aluminum and/or silver. For example, each of the resonators 1402a–1402h may have an inner portion 1407a–1407h that may be empty (i.e., filled with air) and/or solid. Where the inner portions 1407a–1407h are empty, then the resonators may be hollow cylinders. Further, the resonators 1402a–1402h may optionally be made of aluminum with hollow inner portions 1407a–1407h, and externally coated with silver (as shown in FIGS. 20–29) to reduce loss within the delay arrangement 1400.

The delay arrangement 1400 may further have an input port 1405 coupled via a wire 1403 or other conductive material, and/or an output port 1404 coupled via a wire 1406 or other conductive material.

The resonators may be arranged within the housing to provide for a U-shaped path for the signal to be delayed, as is well known in the art. In the embodiment shown in FIG. 14, the path may start at the input port 1405, then to the resonator 1402a, then to the resonator 1402b, then to the resonator 1402c, then to the resonator 1402d, then to the resonator 1402e, then to the resonator 1402f, then to the resonator 1402g, then to the resonator 1402h, and then out the output port 1404. The path may be defined according to the relative distances between the resonators 1402a–1402h and/or walls and apertures (not shown in FIG. 14) appropriately placed between the resonators 1402a–1402h.

To improve the flatness of the delay response of the delay arrangement 1400 over a range of frequencies, particular ones of the resonators 1402a–1402h may be capacitively coupled with particular other ones of the resonators 1402a–1402h. Thus, the delay arrangement 1400 would thereby provide a mix of both inductive and capacitive coupling. Although inductive and capacitive coupling is well known for filters, such an arrangement has not heretofore been previously utilized in a cavity delay arrangement as discussed in this application.

The applicant has found that the flatness of cavity delay arrangements may be substantially improved by capacitively coupling resonators that have an odd number of resonators in the main signal path there between. For example, as shown in FIG. 14, the resonators 1402c and 1402e may be capacitively coupled with each other. In this example, an odd number of resonators (i.e., one resonator—the resonator 1402d) are in the signal path between the resonators 1402c and 1402e. Other examples of which pairs of the resonators may be coupled together such that an odd number of resonators in the signal path are there between are: the resonator pair 1402b, 1402f (with the resonators 1402c, 1402d, 1402e in the signal path there between), the resonator pair 1402c, 1402g (with the resonators 1402d, 1402e, 1402f in the signal path there between), and the resonator pair 1402d, 1402f (with the resonator 1402e in the signal path there between).

In fact, the applicant has found that the delay arrangement may have the most flat delay response where the capacitive coupling is made with a resonator located at the turn of the U-shaped path (i.e., in the embodiment shown in FIG. 14, the resonators 1402d or 1402e are at the turn of the U-shaped path). This is because the signal is strongest near the end of rows of cavities, e.g., at the turn in the path. The turn may be a 90-degree turn. Thus, in the embodiment shown in FIG. 14, the capacitive coupling that would provide the flattest delay response would be between either the pair of resonators 1402c, 1402e, or the pair of resonators 1402d, 1402f.

To capacitively couple the resonators, a capacitive probe may be used. It should be noted that in alternative embodiments, the inductance and capacitance might be reversed. In other words, the resonators may normally capacitively couple with each other, and the capacitive probe may instead be an inductive probe. For example, in these embodiments, the cavities may be capacitively coupled together with the angular cross coupling being an inductive window. For example, each of the window apertures may be replaced by a capacitive probe and the capacitive probe may be replaced with a window aperture. This arrangement, however, is not the most preferred.

Figure 19:
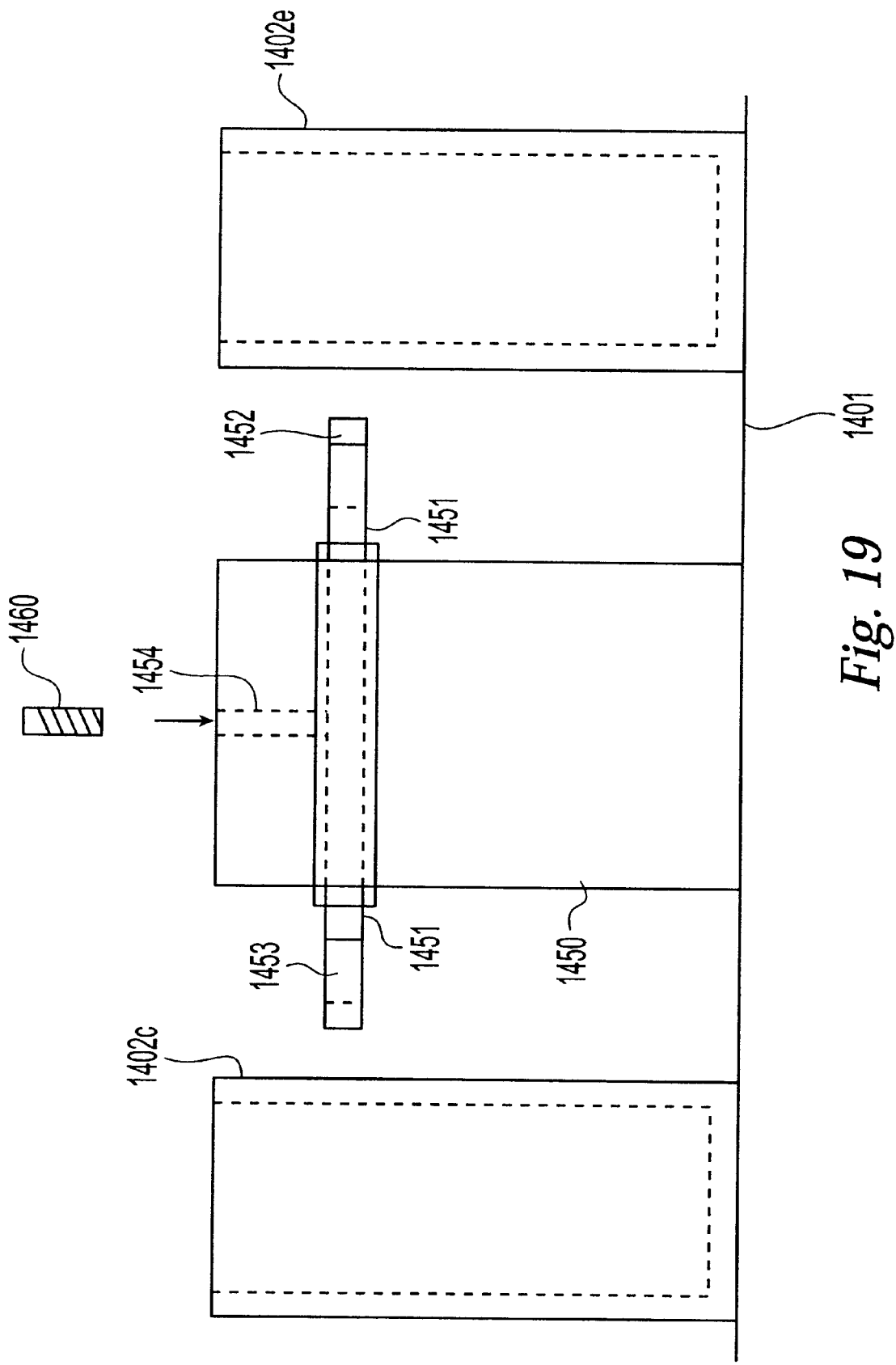
FIG. 19 is a side view from perspective A—A of the filter shown in FIG. 14.
Figure 20:
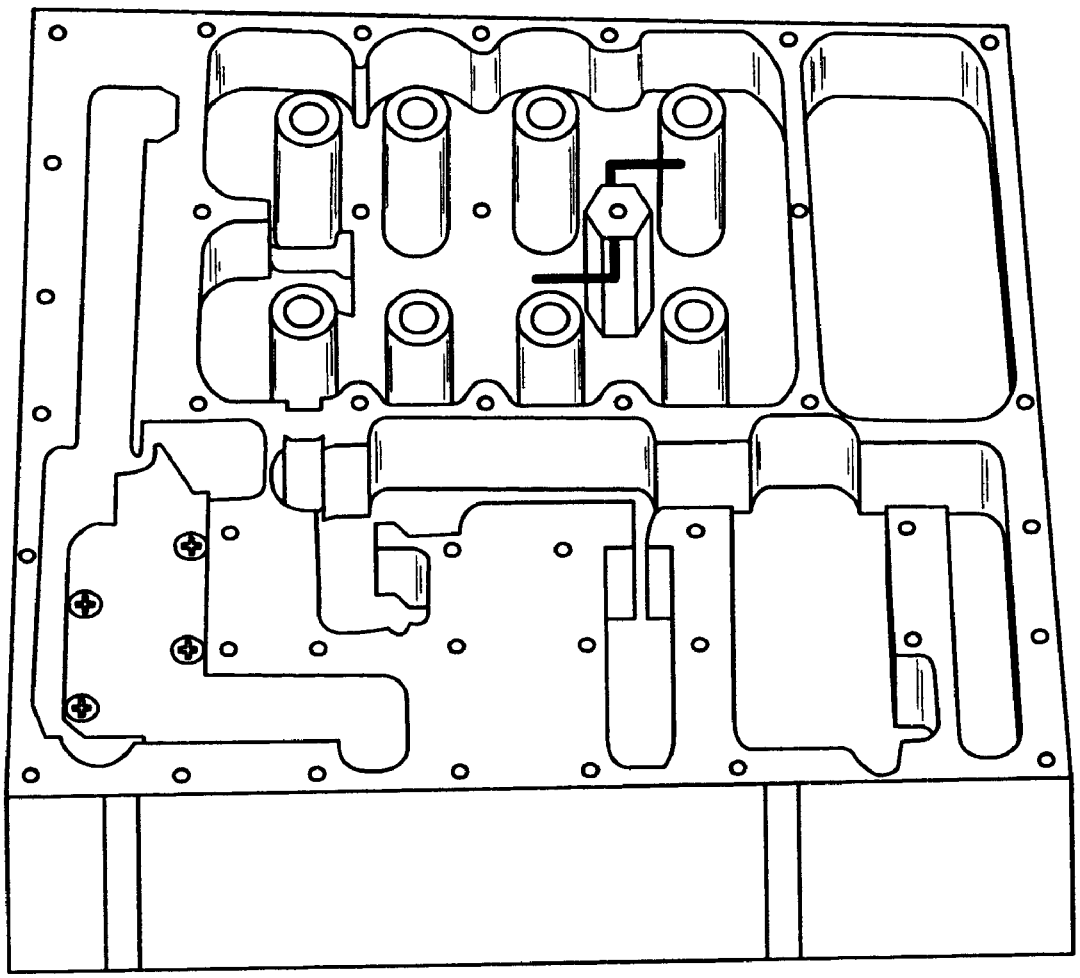
FIGS. 20–29 are photographs of exemplary filters having capacitive probes according to aspects of the present invention.
Figure 21:
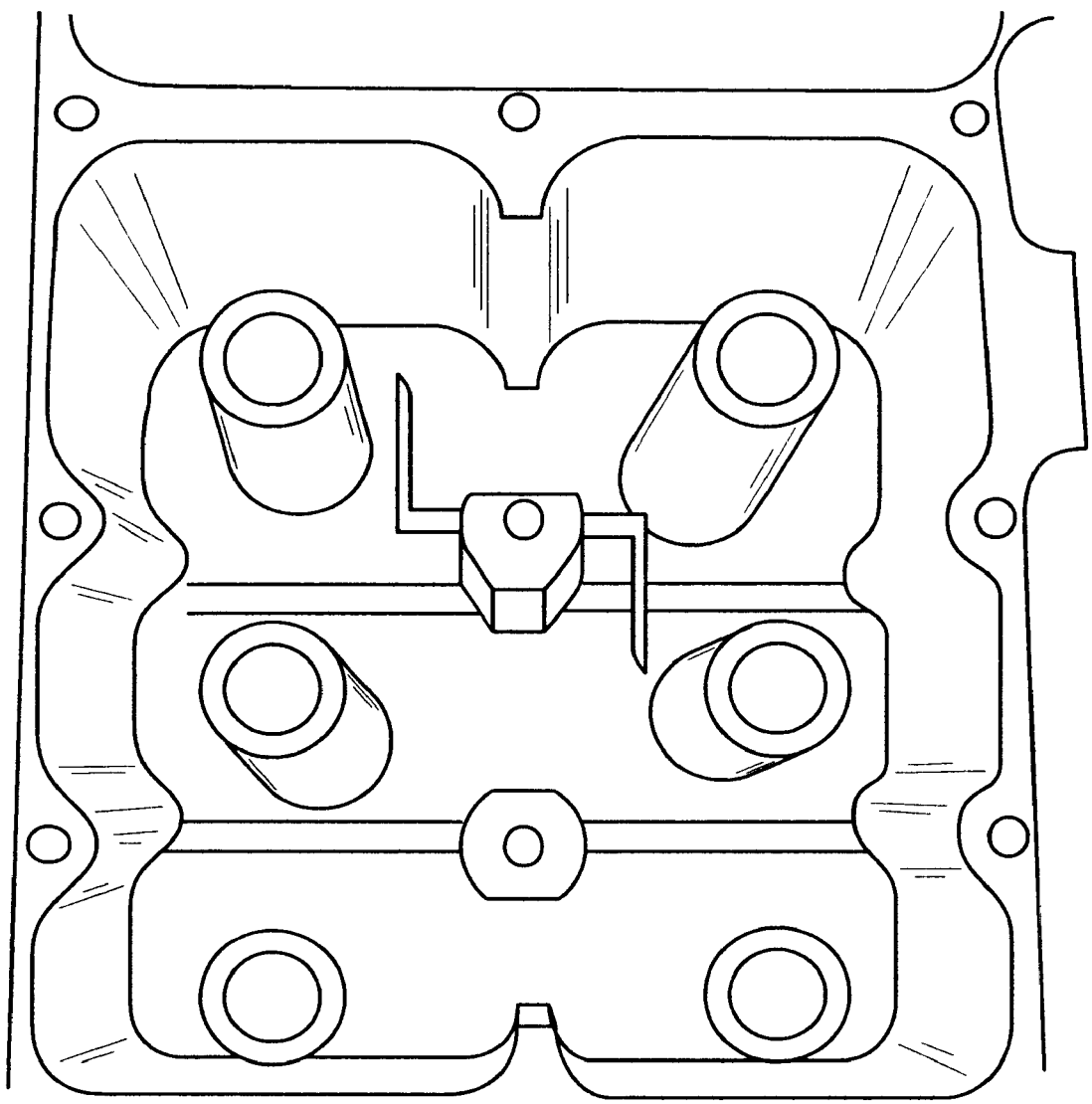
Figure 22:
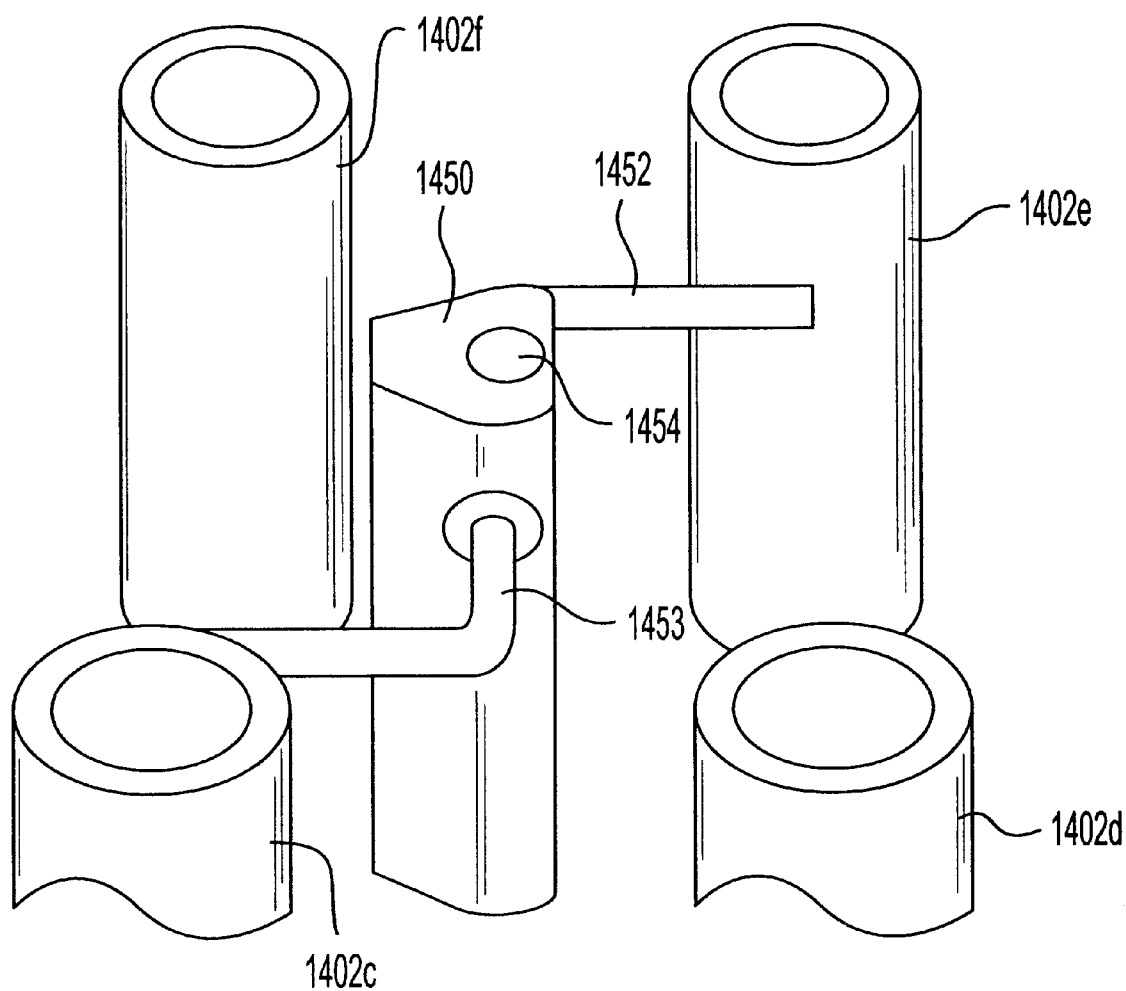
Figure 23:
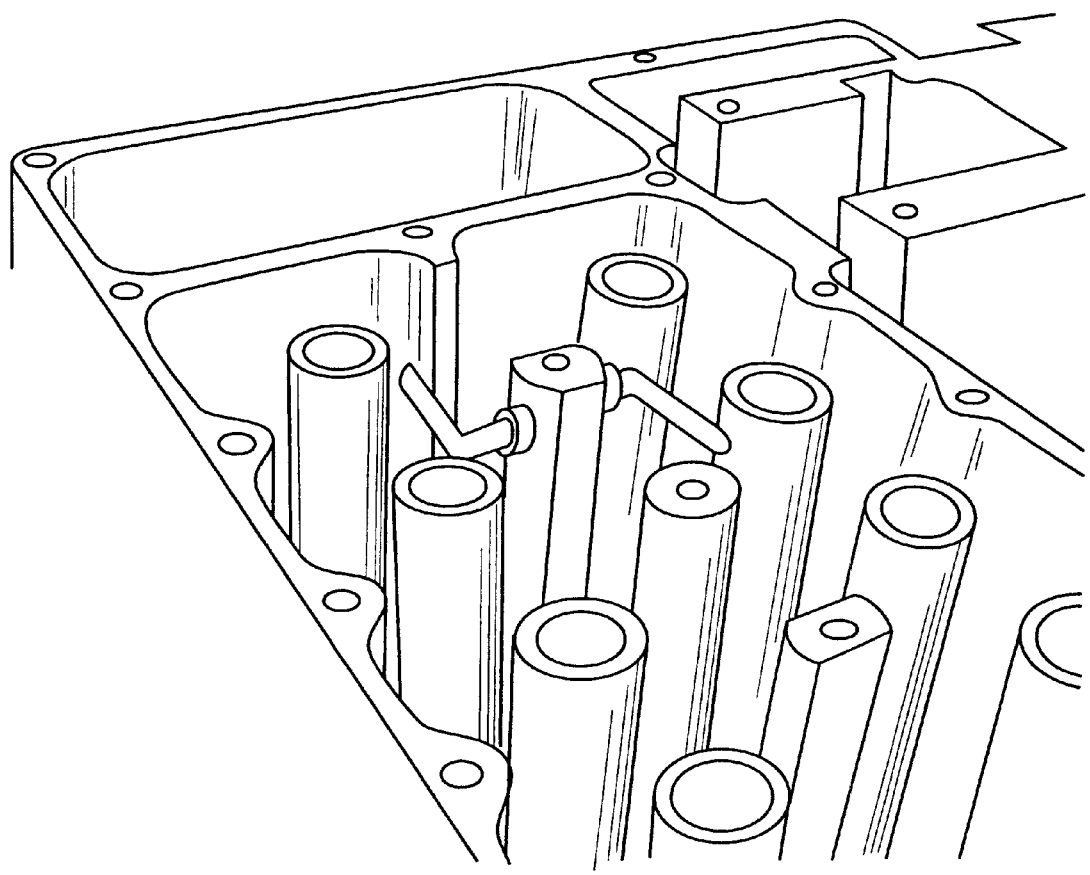
Figure 24:
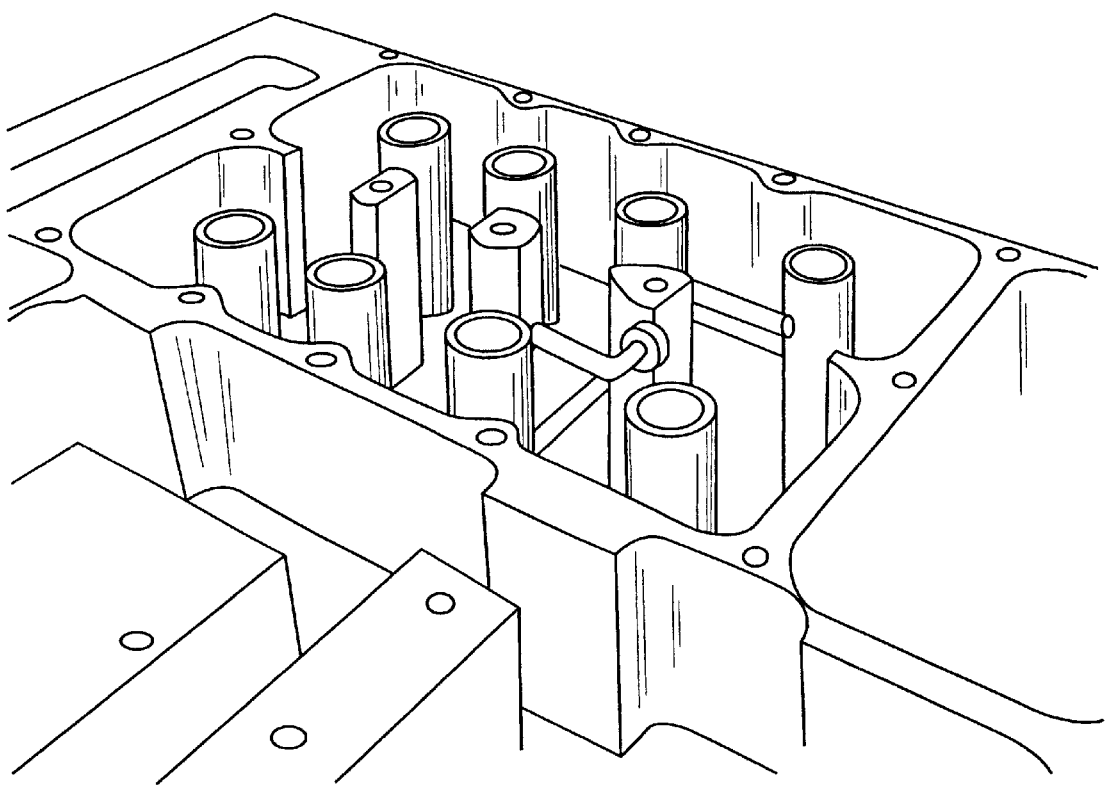
Figure 25:
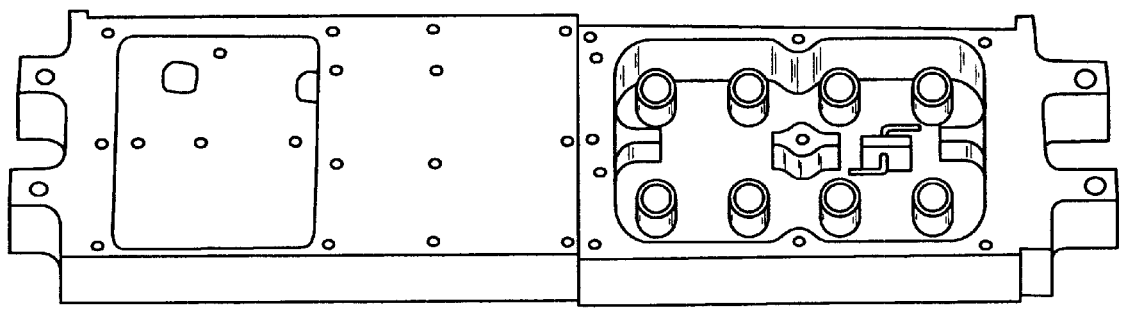
Figure 26:
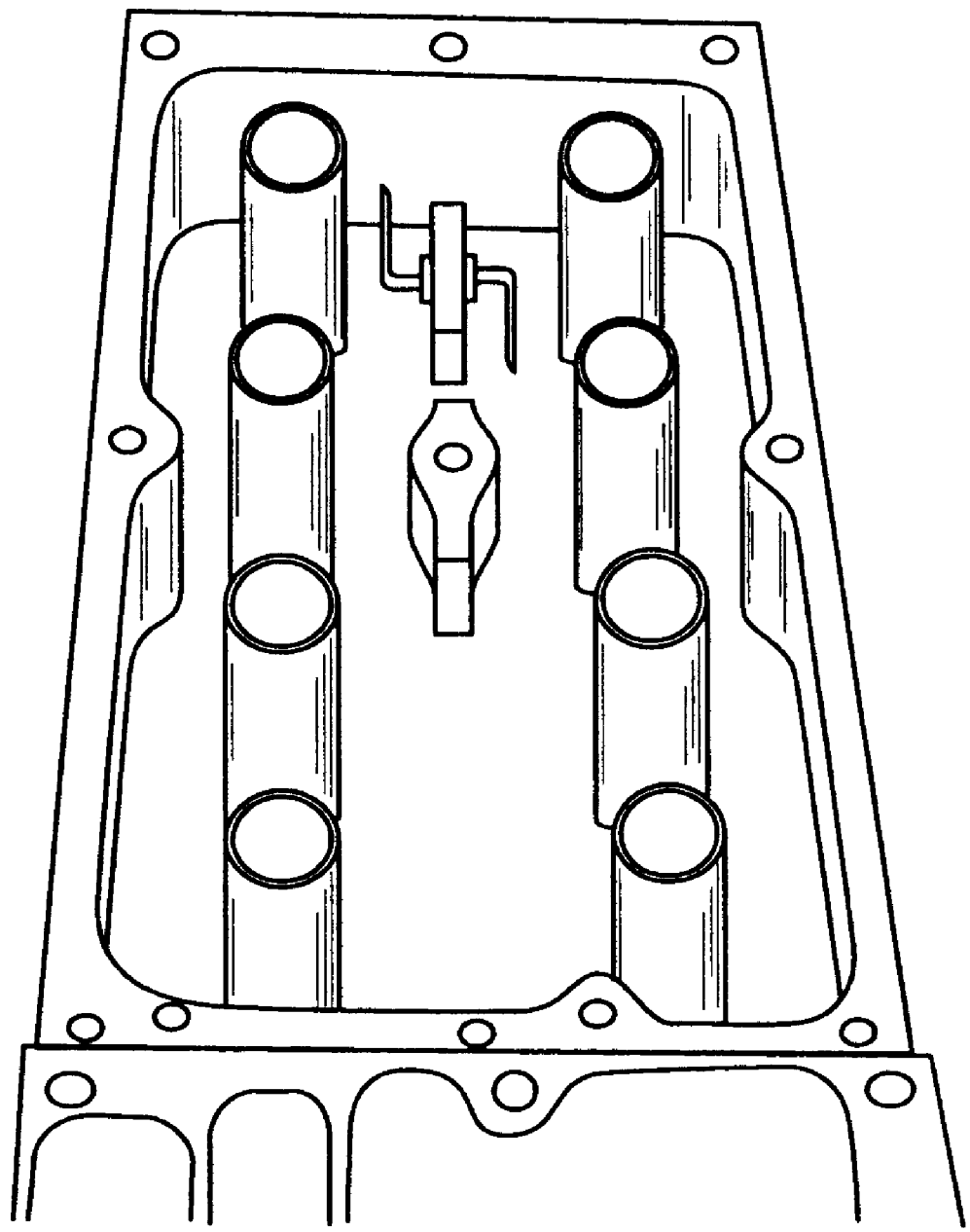
Figure 27:
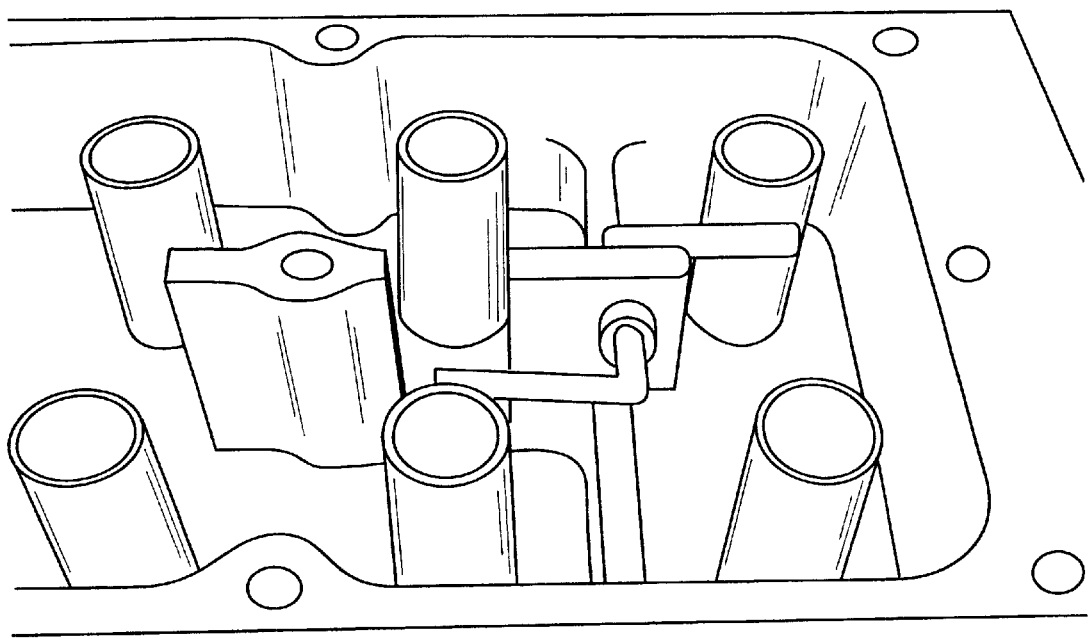
Figure 28:
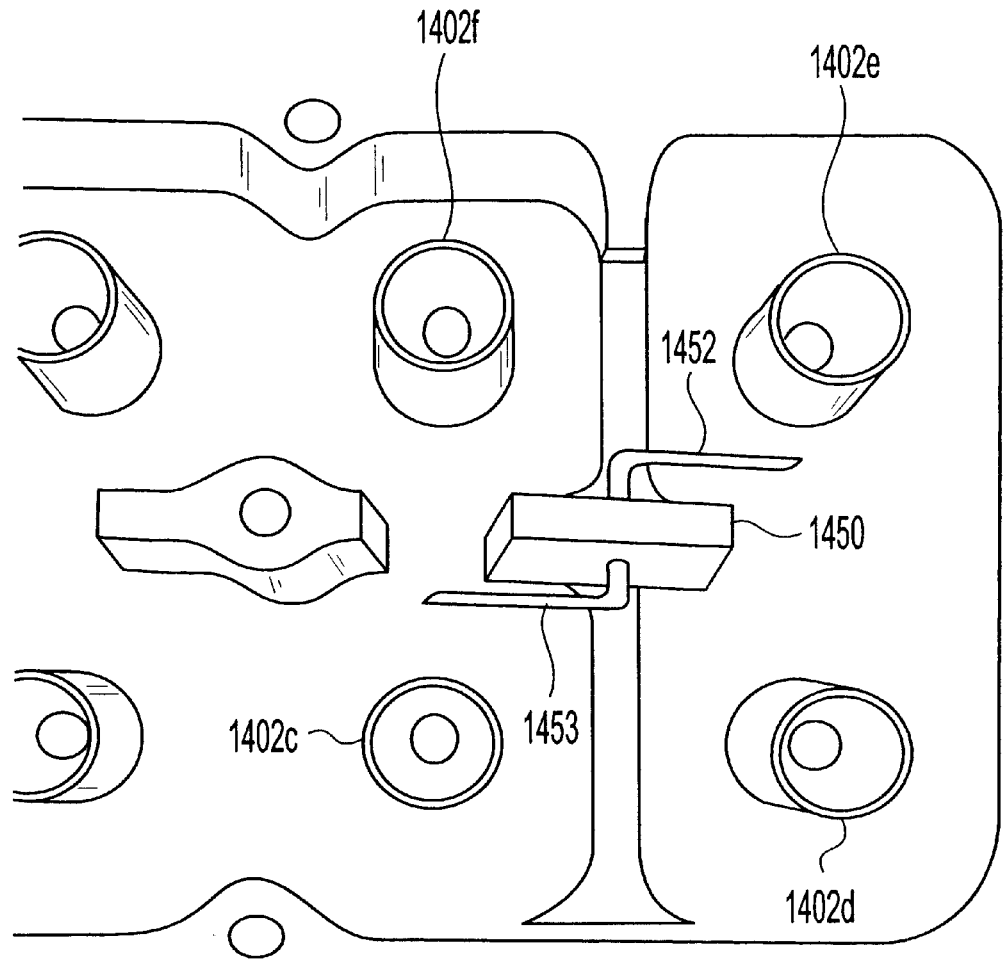

According to one exemplary embodiment, a capacitive probe may include one or more of the following in any combination: a wall 1450, a conductive bar 1451 disposed through the wall 1450, and/or conductive extensions 1452, 1453 disposed proximate to each of the resonators 1402e, 1402c, respectively. Because the extensions 1452, 1453 and the bar 1451 are each conductive, and because the extensions 1452, 1453 are disposed proximate to the resonators, the resonators are capacitively coupled with each other. The wall 1454 may include a hole 1454 through which a screw (screw 1460 in FIG. 19) may be screwed to lock the bar 1451 into place relative to the wall 1450. The capacitive probe may be insulated from the wall. For a better understanding of the embodiment shown in FIG. 14, please refer to FIG. 19, which shows the embodiment of FIG. 14 from view A—A.

Figure 29:
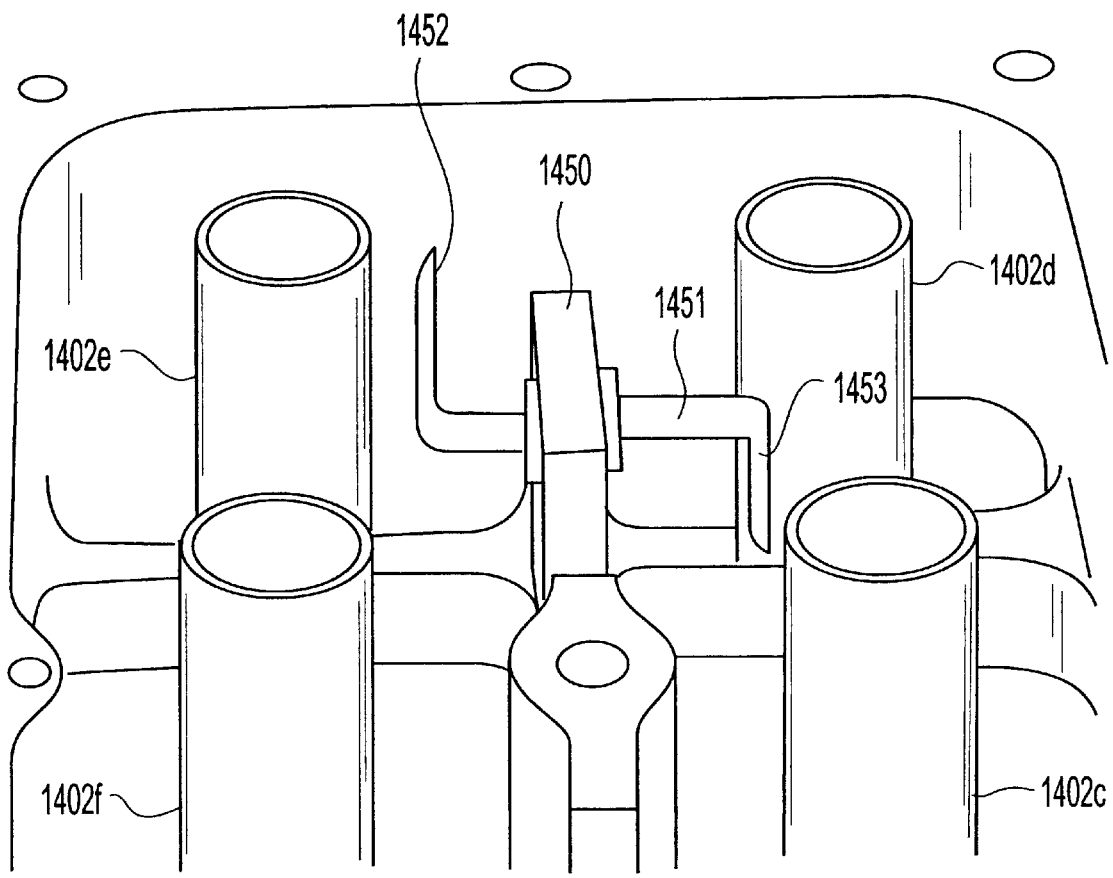

The extensions 1452, 1453 may be soldered or welded to the bar 1451 (as shown in FIG. 29), or the bar and the extensions 1452, 1453 may be one continuous piece that is appropriately bent. In one exemplary embodiment, the bar 1451 and the extensions 1452, 1453 together form a "z" shape, as shown in FIG. 14. The extensions 1452, 1453 may each be bent to adjust the amount of distance D1, D2 between the respective extensions 1452, 1453 and the resonators 1402e, 1402c, thereby adjusting the amount of capacitive coupling that occurs between the resonators 1402e, 1402c and the extensions 1452, 1453.

Figure 15:
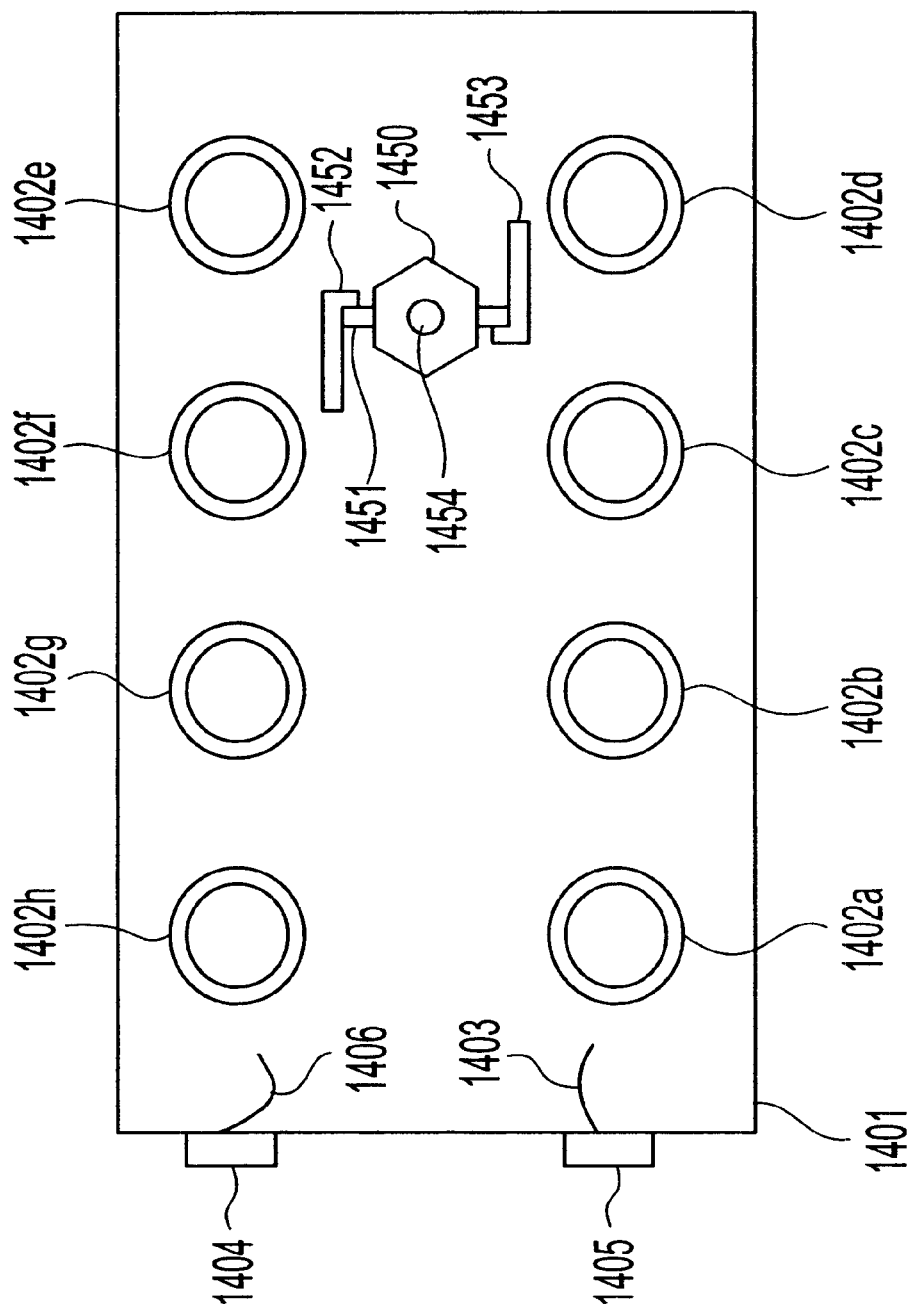

FIG. 15 shows an alternative embodiment of the delay arrangement 1400. Here, the resonators 1402d and 1402f are capacitively coupled with each other via a capacitive probe.

Figure 16:
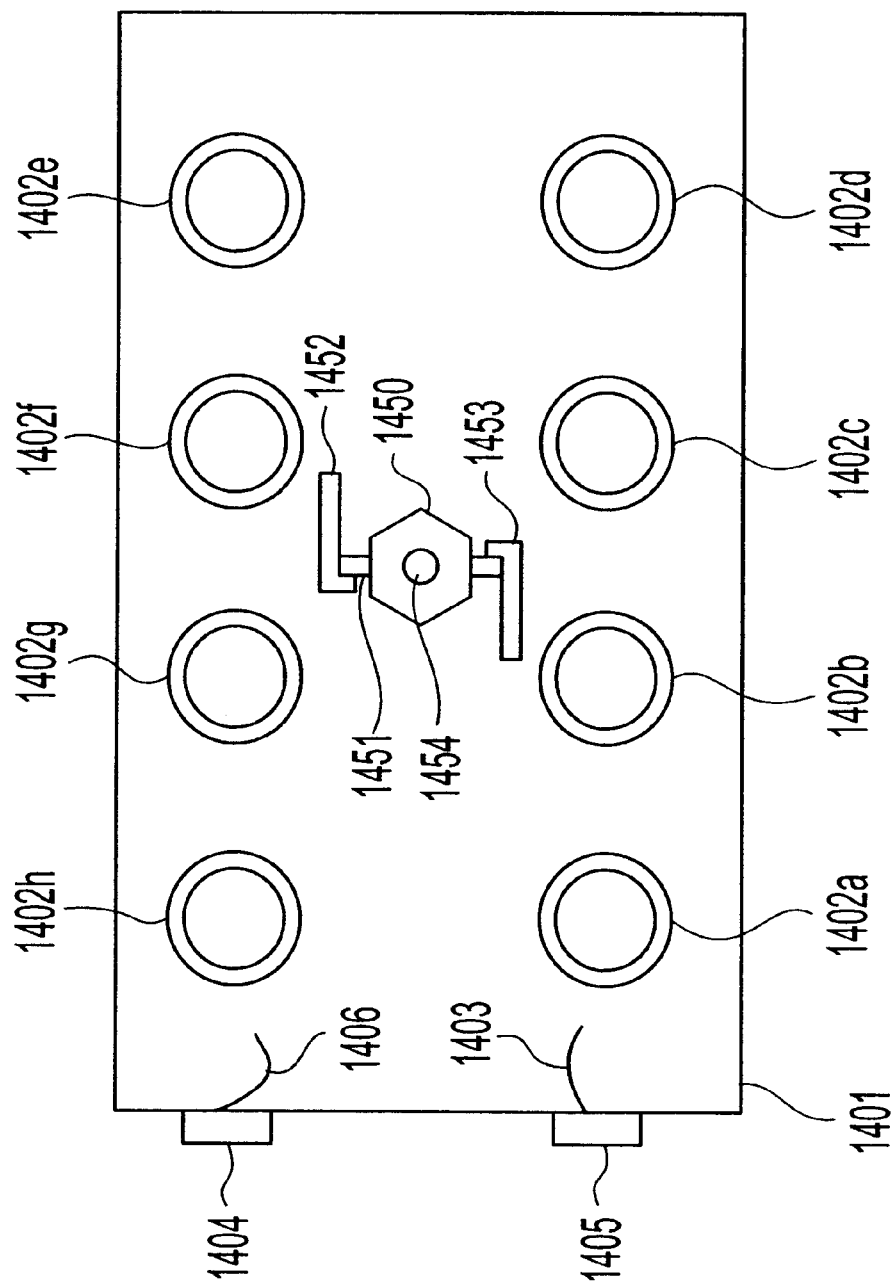

FIG. 16 shows yet another embodiment where the resonators 1402b and 1402f are capacitively coupled with each other via a capacitive probe.

Figure 17:
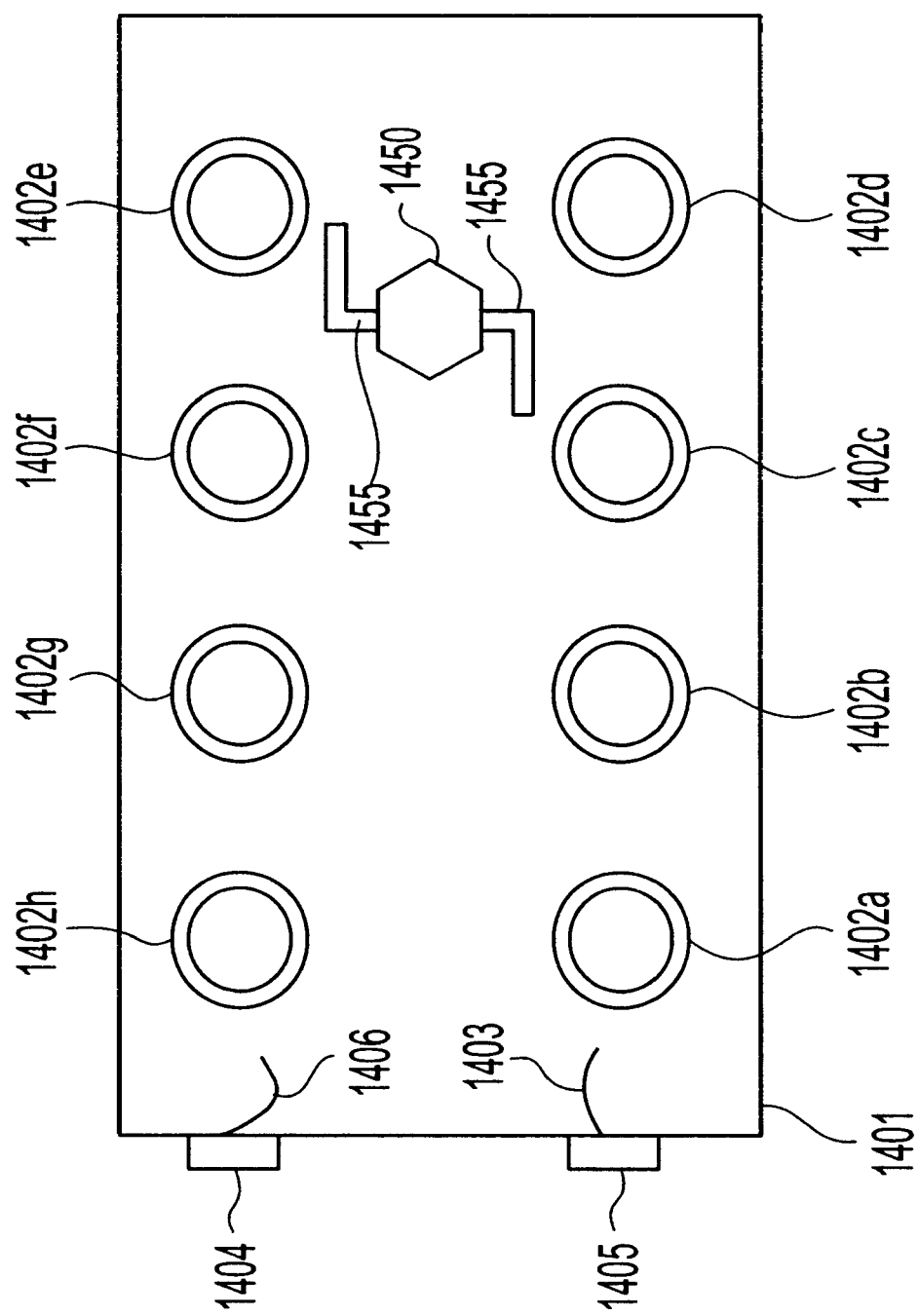

FIG. 17 shows the delay arrangement 1400 having yet another alternative embodiment of a capacitive probe. Here, the capacitive probe may include an insulated wall section 1450 and/or a conductive bar 1455 bent into a "z" shape (a "z-bar") or other appropriate capacitive coupling arrangement. The z-bar 1455 may be a single piece or a plurality of sections conductively connected together.

Figure 18:
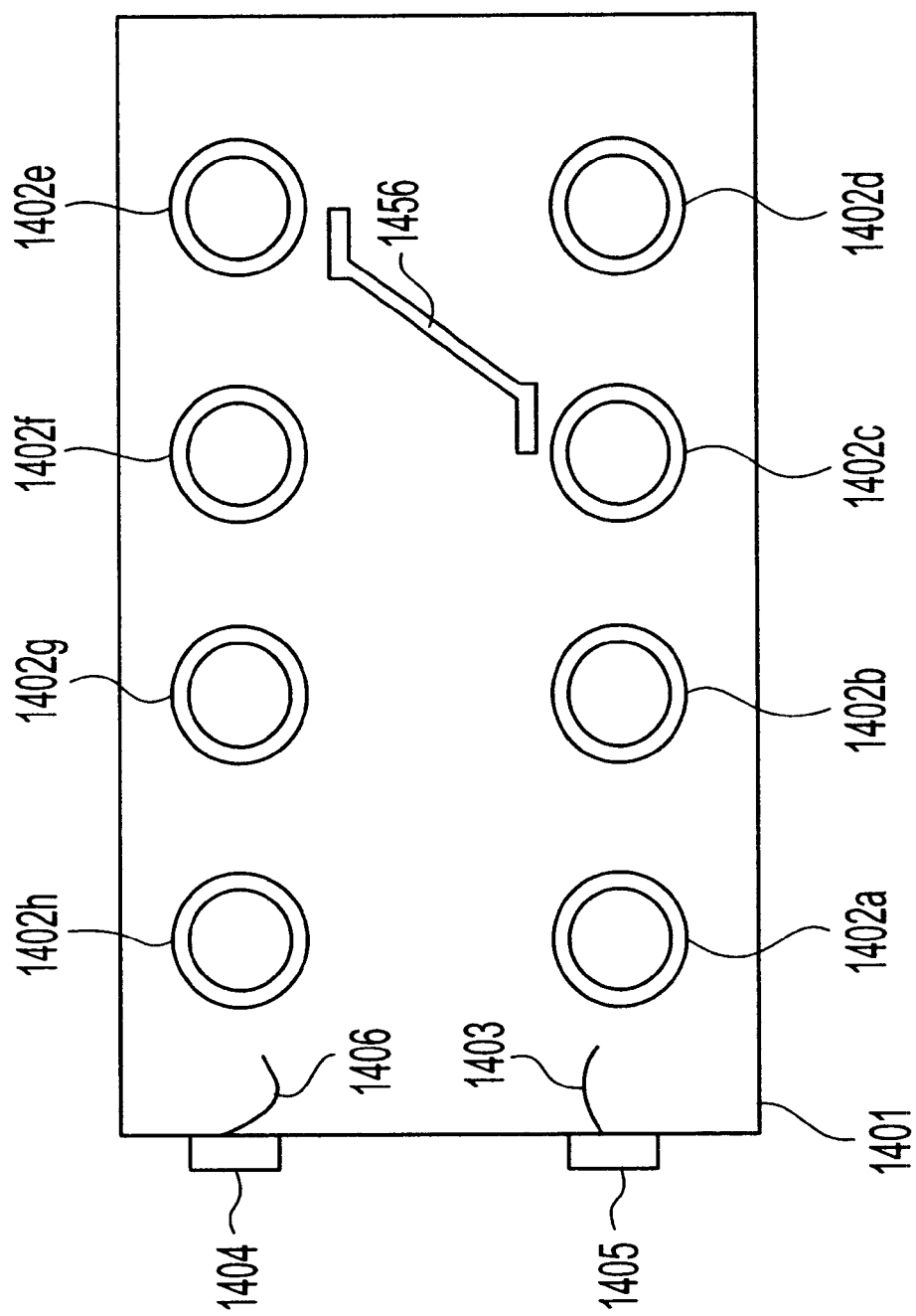

FIG. 18 shows the delay arrangement 1400 having yet another alternative embodiment of a capacitive probe. Here, a capacitive probe 1456 is shown being an elongated structure that capacitively couples the resonators 1402c and 1402e with each other.

Figure 13:
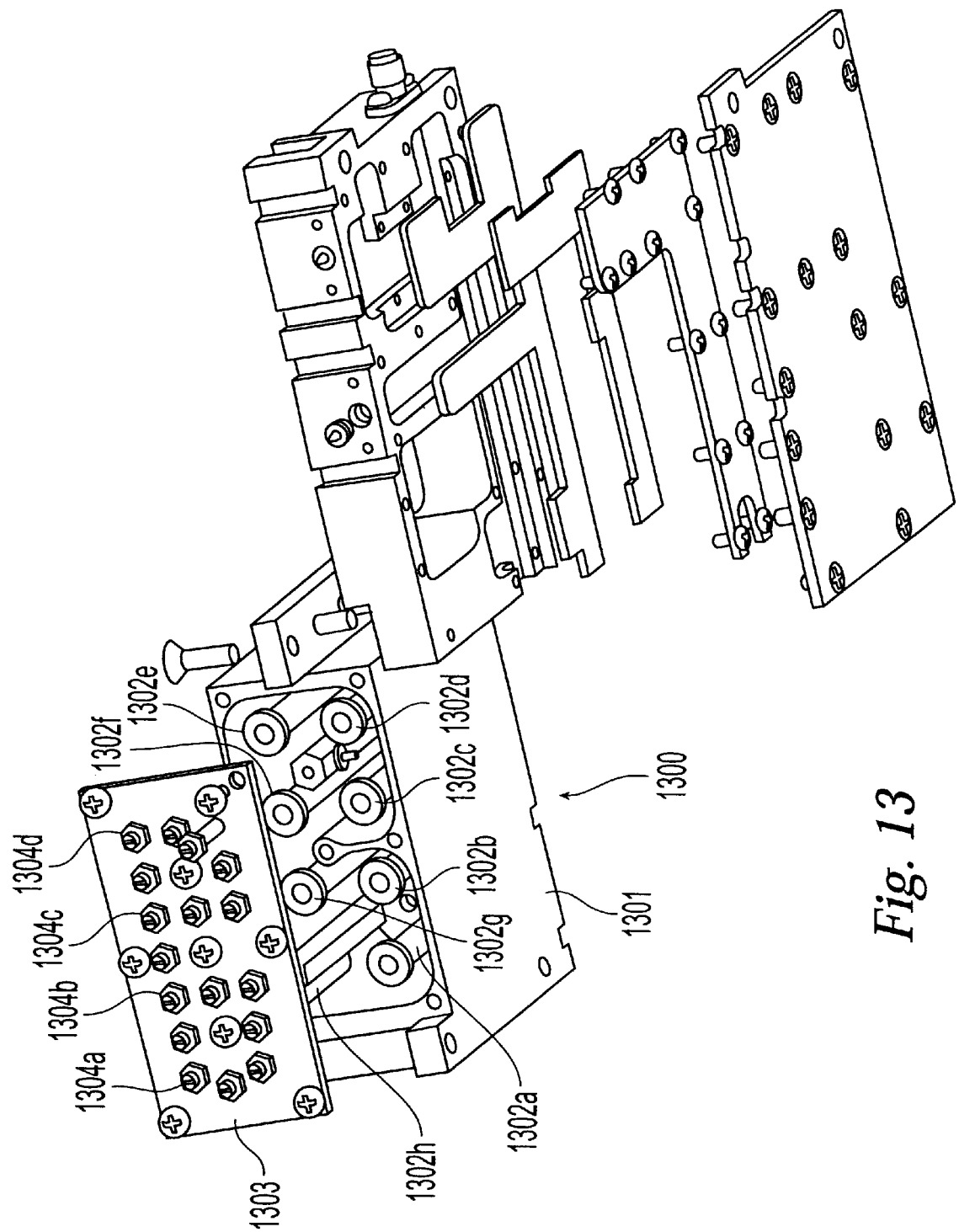
FIG. 13 is an exploded perspective view of an apparatus including a filter according to aspects of the present invention.

Referring to FIG. 13, yet another alternative embodiment of the invention is shown, where the main delay line 6 may be implemented as one or more delay equalization filters, such as delay arrangement 1300. The delay arrangement 1300 may include a housing 1301 and/or a lid 1303 that may be screwed down and secured to the housing 1301. The housing 1301 and/or the lid 1303 may preferably be partially or completely made of a conductive material such as aluminum. The delay arrangement 1300 may further have a plurality of inductively-coupled resonators 1302a–1302h, each of which may be disposed in the housing 1301. The resonators 1302a–1302h may be partially or completely made of a conductive material such as aluminum and/or silver. A plurality of tuning screws 1304a–1304d may be disposed in the lid 1303, and conductively coupled with the lid 1303, for adjusting capacitive coupling between the resonators 1302a–1302h and the lid 1303.

FIGS. 20–29 are photographs showing various views of exemplary embodiments of delay arrangements having capacitive probes according to aspects of the present invention.

Alternative Embodiment of the High Power Delay Arrangement

Figure 30:
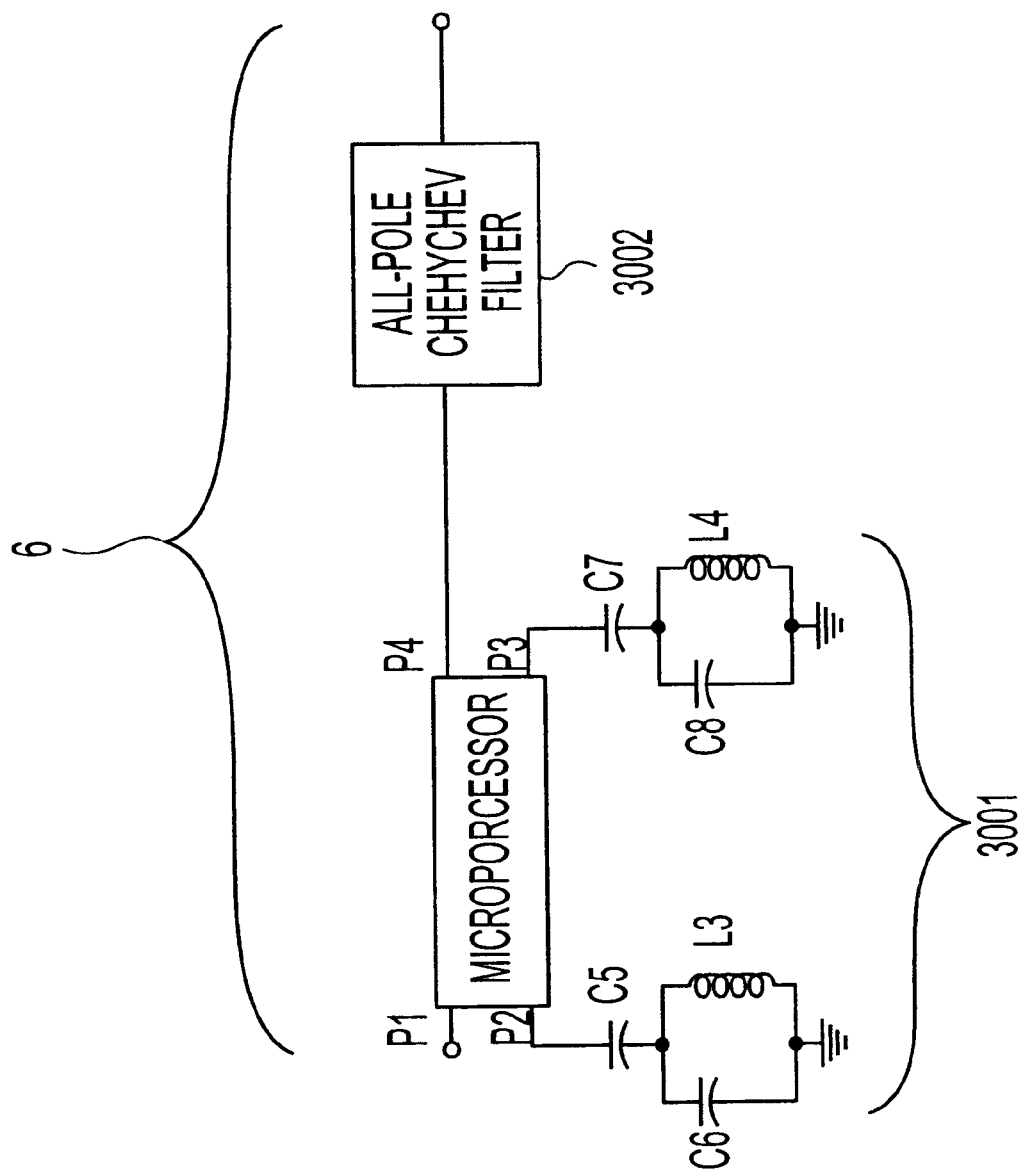
FIG. 30 is a functional block diagram of an exemplary embodiment of a main delay line according to aspects of the present invention.

In an alternative embodiment, such as is shown in FIG. 30, the main delay line 6 may be embodied as a hybrid quadrature 90-degree phase shift coupler multicoupler loaded by two resonators (loaded multicoupler) 3001 cascaded with an all-pole Chebychev filter 3002. The all-pole Chebychev filter 3002 may preferably be a cavity filter having zeros at DC and/or infinity.

The loaded multicoupler 3001 may be electrically configured in the same way as the delay compensating circuit 29, except that the loaded multicoupler 3001 may preferably be built to be more suitable for high power. In FIG. 30, the loaded multicoupler 3001 is depicted functionally as a multicoupler loaded with resonators. The first resonator in FIG. 30 includes capacitors C5 and C6, and inductor L3. The second resonator in FIG. 30 includes capacitors C7 and C8, and inductor L4. The first and second resonators may be variously configured. In exemplary embodiments, the first and second resonators may have a resonance value that is about the same, substantially the same, and/or identical. In the most preferred embodiments, the first and second resonators are identical.

Figure 31A:
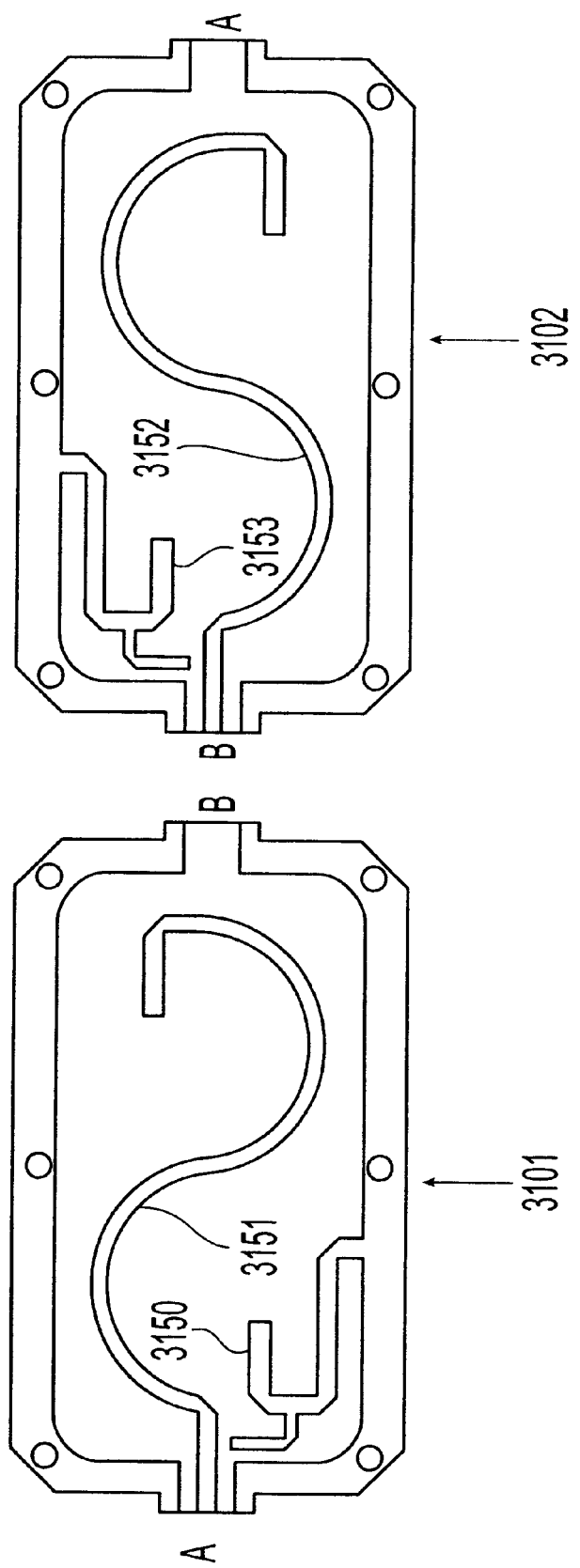
Figure 31B:
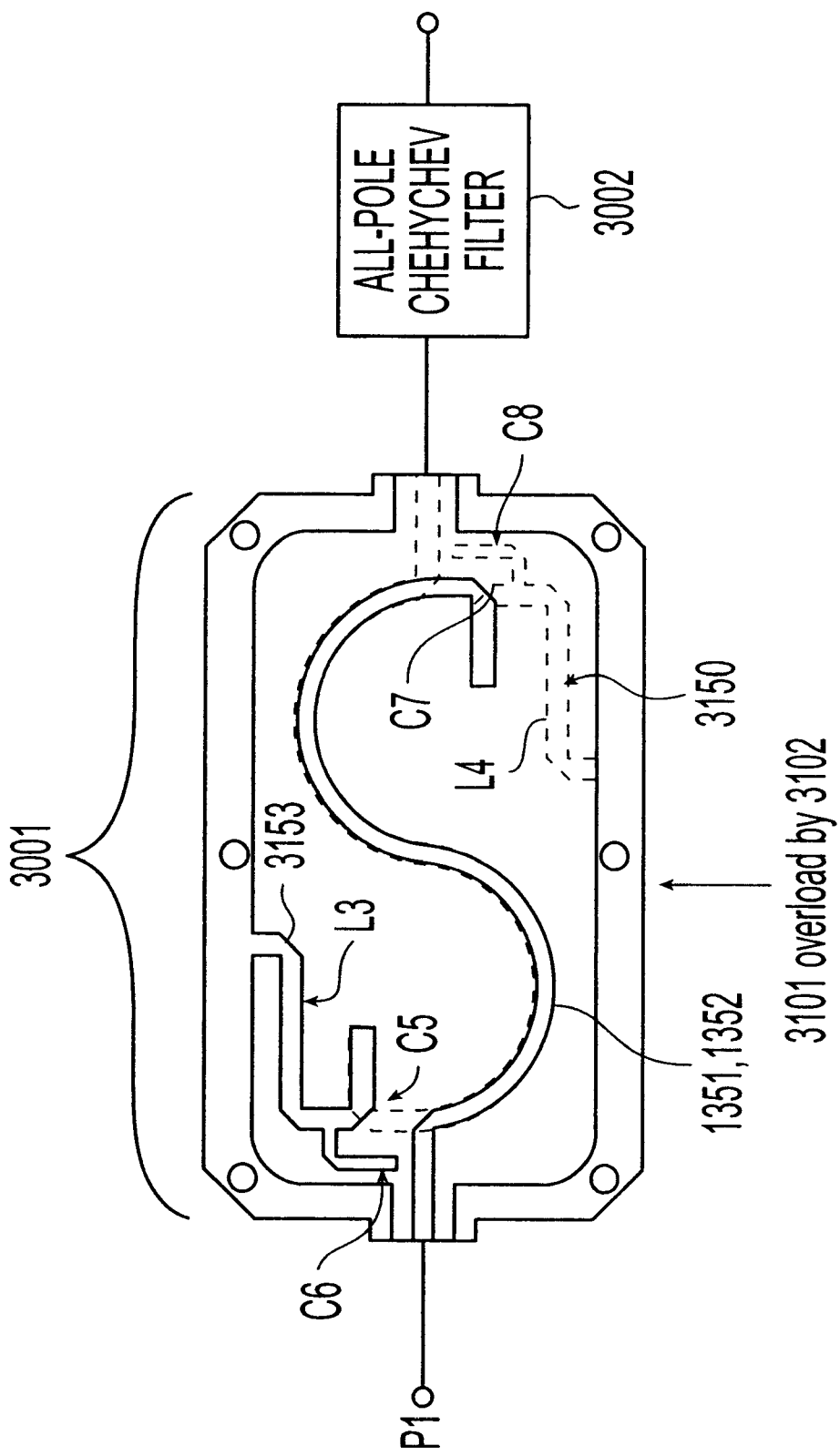

Because the delay line 6 is preferably capable of handling high power, it may be preferable to embody the loaded multicoupler 3001 as a stripline or microstrip circuit instead of as discrete components. Such a high power loaded multicoupler is shown in FIGS. 31A and 31B. Referring to FIG. 31A, the loaded multicoupler 3001 may include two stripline circuits 3101, 3102 overlaid with each other such that the "A" labeled sides match up and the "B" labeled sides match up. The stripline circuit 3101 may have a dielectric substrate 3121 with conductive strips 3150, 3151 disposed thereon as shown, and the stripline circuit 3102 may have a dielectric substrate 3122 with conductive strips 3152, 3153 disposed thereon as shown. When the stripline circuits 3101, 3102 are properly overlaid, the conductive strips 3150, 3151, 3152, 3153 may align with each other as depicted in FIG. 31B. Also, when the stripline circuits 3101, 3102 are properly overlaid, the dielectric substrates may be back-to-back, and the sides of the stripline circuits 3101, 3102 having the conductive strips 3150, 3151, 3152, 3153 may be facing outward. Thus, the two substrates prevent the conductive strips 3150, 3151 from directly contacting the conductive strips 3152, 3153. The corresponding locations on the overlaid stripline circuits 3101, 3102 of the capacitors C5, C6, C7, C8 and the inductors L3, L4 are shown in FIG. 31B.

Figure 32A:
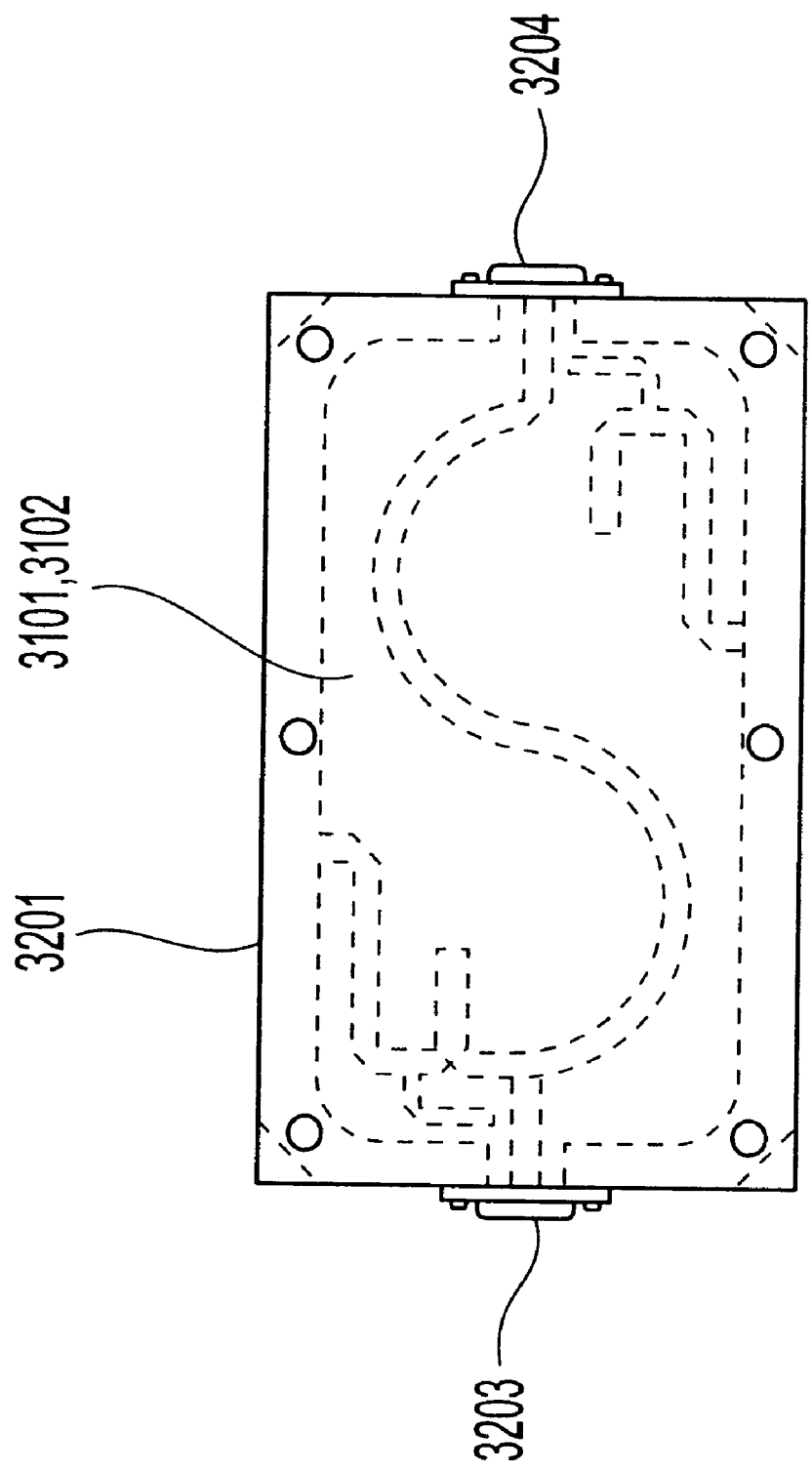
Figure 32B:
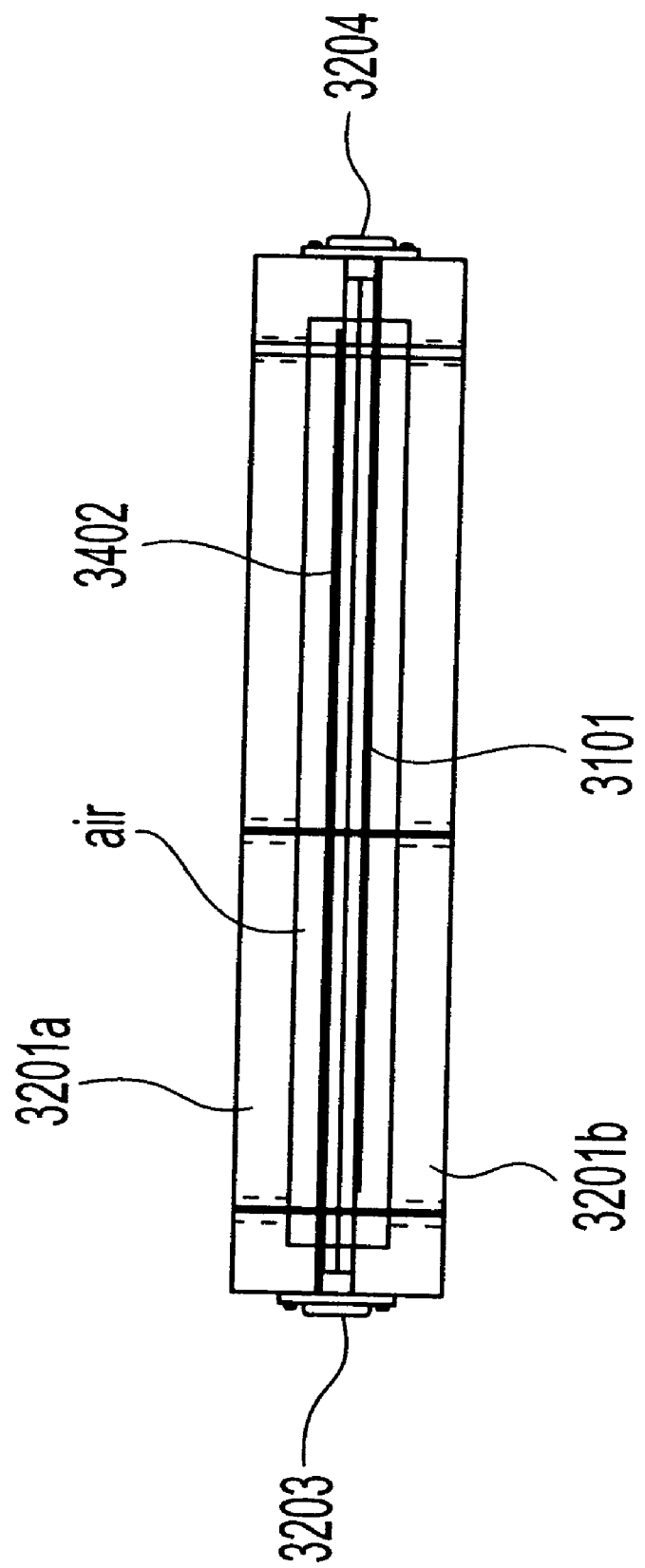
FIG. 32B is a side plan view of the loaded multicoupler of FIGS. 31A–32A.

Referring to FIGS. 32A and 32B, the overlaid stripline circuits 3101, 3102 may be housed as suspended substrate boards in a housing 3201. The housing 3201 may include an input port 3203 conductively coupled to the conductive strip 3152 and an output port 3204 conductively coupled to the conductive strip 3151. The housing 3201 may include two halves 3201a, 3201b that may be screwed together.

Figure 32C:
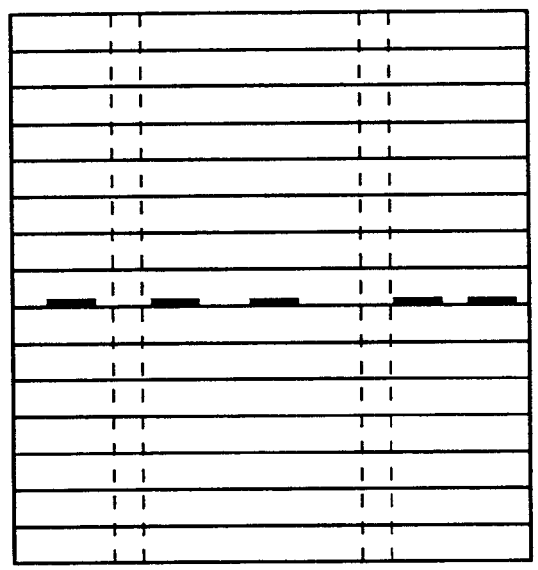
FIGS. 32C and 32D are a side view and a top plan view of the further embodiments of the loaded multicoupler.
Figure 32D:
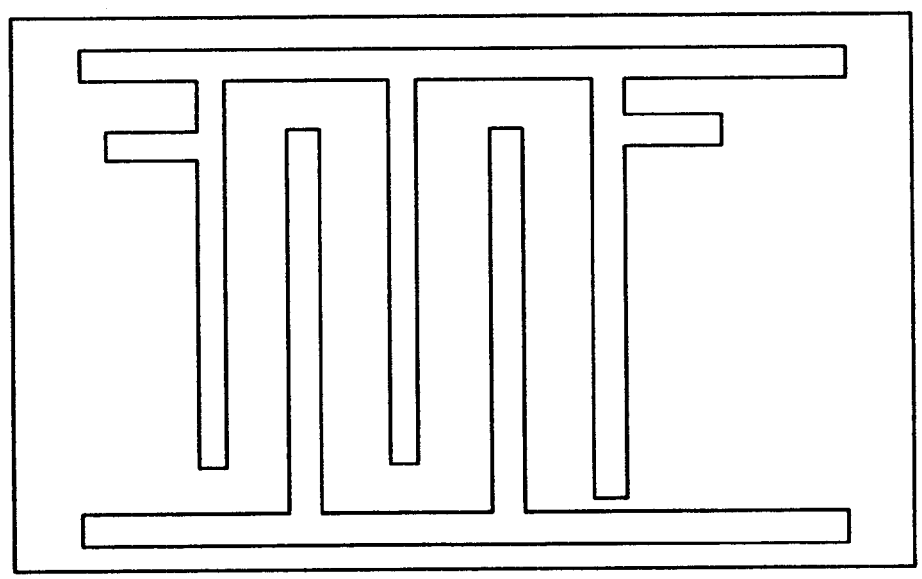

In still further embodiments of the loaded multicoupler, FIGS. 32C and 32D may use a multi-layer configuration employing, for example, low temperature co-fired ceramic. The multi-layer configuration may use a one to 18 layer stack. In exemplary embodiments, a 15–18 layer stack may be utilized as shown in FIG. 32C. The individual layers may comprise one or more of an interdigital configuration, hair-pin configuration, comb-line configuration, or edge-coupled configuration. In one exemplary embodiment, FIG. 32D shows an interdigital configuration of a bandpass filter coupled to the output of a multicoupler. The loaded multi-couplers shown in FIGS. 32C and 32D are available from Dielectric Lab (DLI) (www.dilabs.com) and American Technical Ceramic (ATC) (www.atceramics.com), Additionally, the multicoupler can be fabricated as part of a printed circuit board.

Pre-Tuned Modules

Again referring to FIG. 1, a consistent problem with the construction of a feed-forward high-power amplifier is the tuning of the delay lines coupled to one or more couplers. Conventional delay lines in the low power feed forward path could not be tuned. The present invention allows for pre-tuned modules to be sold for both the high-power and low-power delay arrangements.

Figure 33:
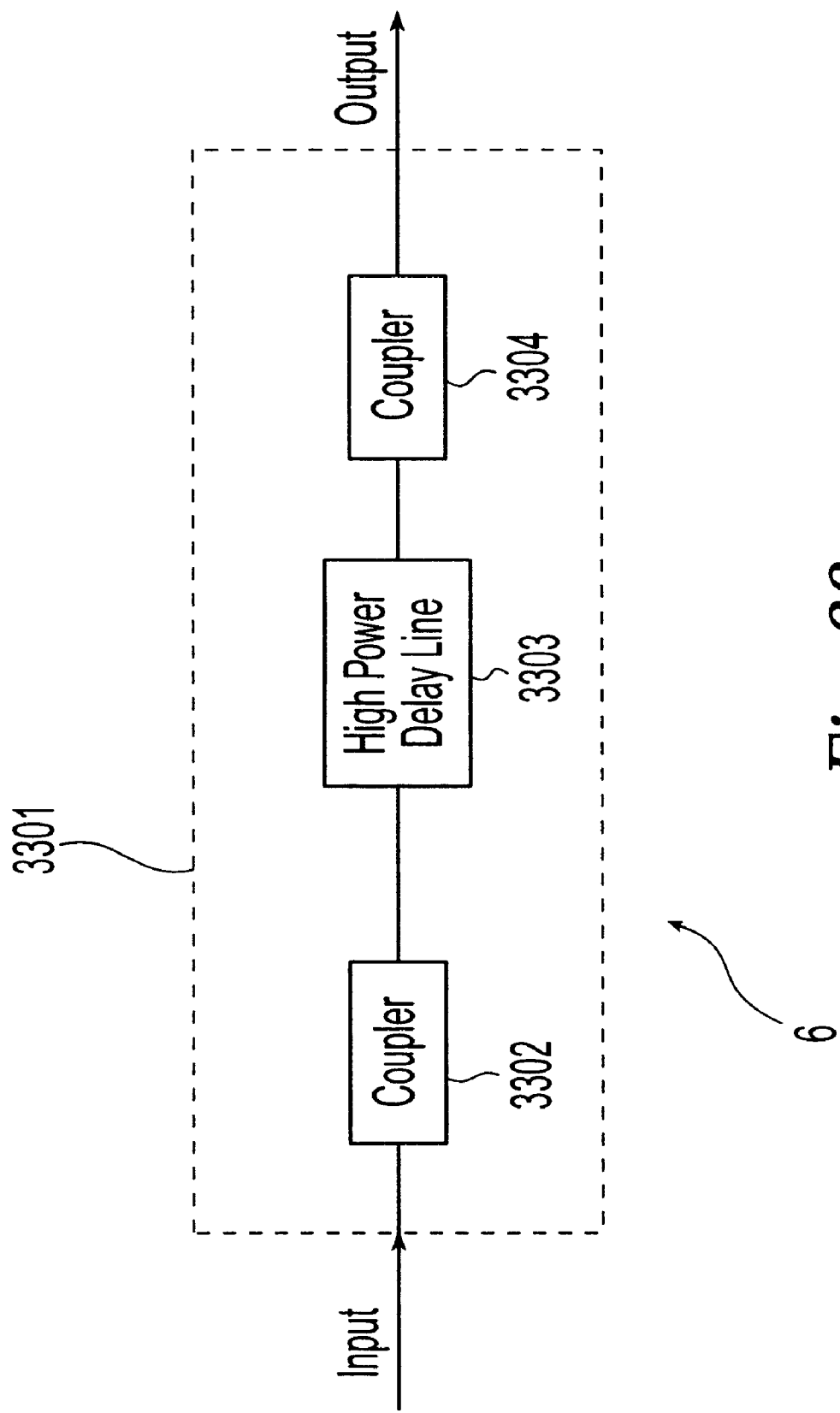
FIG. 33 is a functional block diagram of an exemplary high power pre-tuned main delay line module according to aspects of the present invention.
Figure 34:
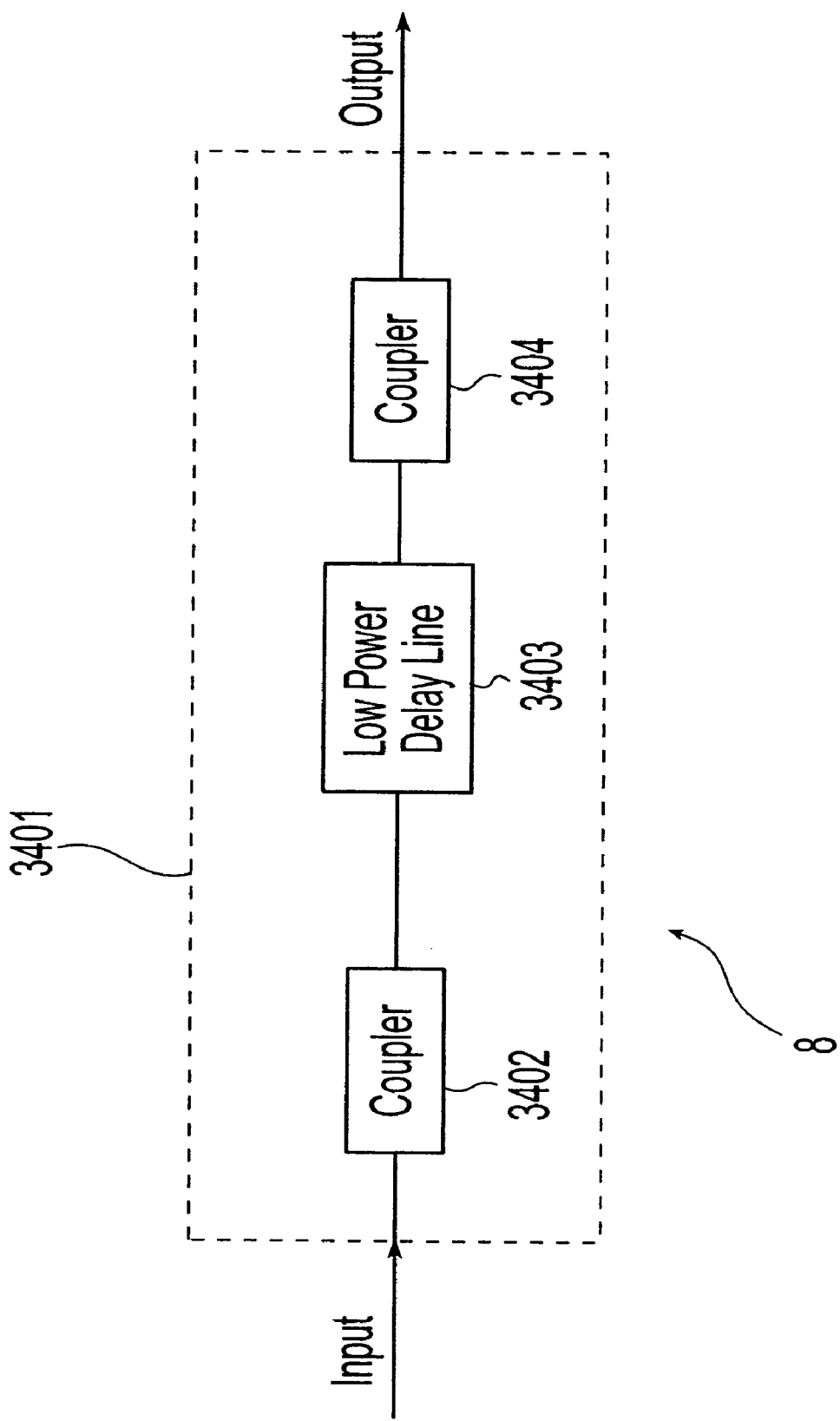
FIG. 34 is a functional block diagram of an exemplary low power pre-tuned secondary delay line module according to aspects of the present invention.

Referring to FIGS. 33 and 34, the main delay line 6 and/or the secondary delay line 8 (both shown in, e.g., FIG. 1) may each be manufactured as pre-tuned modules ready for insertion into an amplifier. The problem with present delay lines is that they must be tuned, which is a painstaking process. It is preferable to have the delay line modules available already tuned so that manufacturers of amplifiers may buy pre-tuned delay modules either custom-tuned or off-the-shelf and insert the pre-tuned delay modules into their amplifier products.

Accordingly, the main delay line 6 may be embodied as a pre-tuned high power delay-line module 3301, and may include a first high power coupler 3302, cascaded with a high power delay line filter 3303, and/or further cascaded with a second high power coupler 3304. The couplers 3302 and/or 3304 may be standard couplers or multicouplers. The high power delay line filter 3303 may be any of the high-power delay line filters discussed herein.

Similarly, the secondary delay line 8 may be embodied as a pre-tuned low power delay-line module 3401, and may include a first low power coupler 3402, cascaded with a low power delay line filter 3403, and/or further cascaded with a second low power coupler 3404. The couplers 3402 and/or 3404 may be standard couplers or they may be multicouplers.

Alternative Embodiment of Lumped Filter

Referring to FIGS. 35–38, an alternate embodiment of the filter 30 is shown formed, once again, from any suitable lumped element components, and in the embodiment shown in FIGS. 35–38, the filter 30 is formed from co-located capacitors formed from lines of the circuit board. Unlike the embodiment shown in FIGS. 3–5, the embodiment shown in FIGS. 35–38 requires only one capacitor and inductor per shunt. The second discrete micro-inductor between the capacitor and ground is not needed. As a consequence, the filter 30 is easier to tune due to the reduction in the number of parts.

Figure 35:
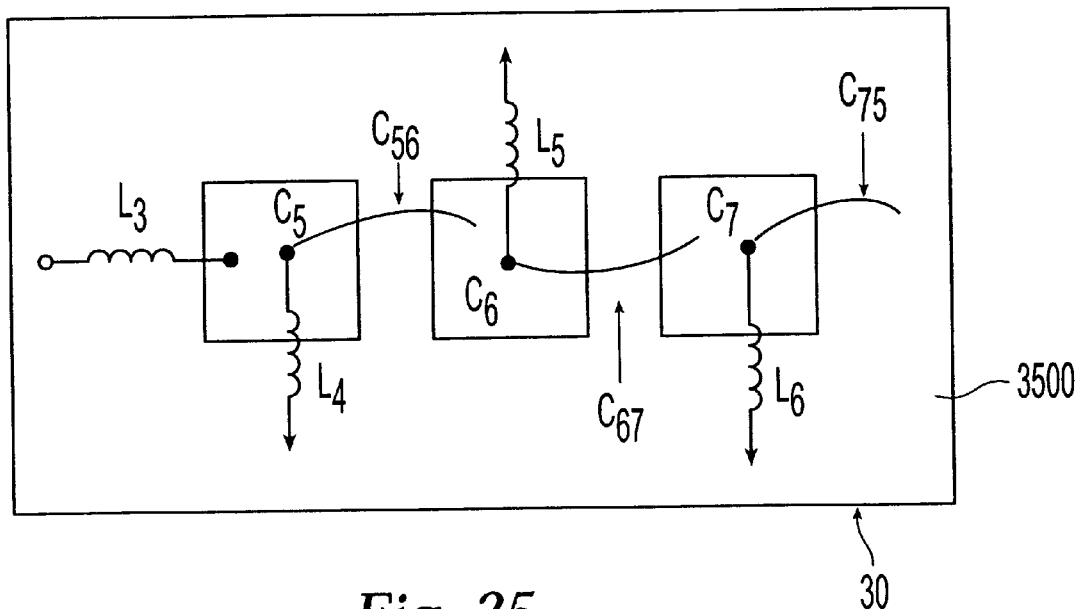
FIG. 35 is a partial pictorial/partial schematic view of an additional embodiment of the present invention.
Figure 36:
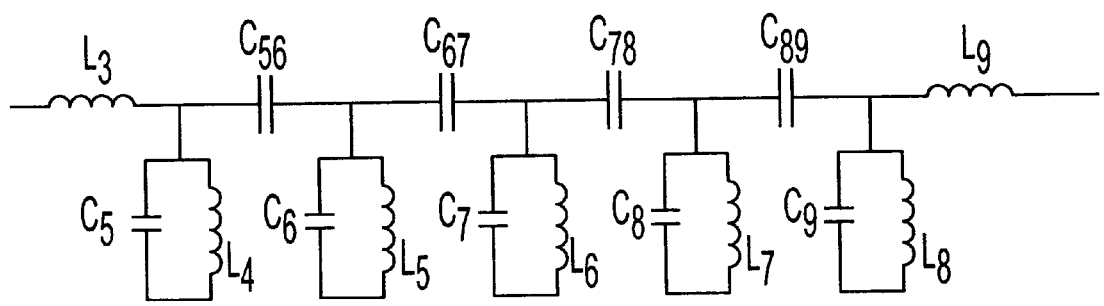
FIG. 36 is a schematic view of the embodiment shown in FIG. 35.

As shown in FIGS. 35–38, the capacitors C5–C9 may be formed as square traces disposed on a circuit card 3500 and co-located to provide capacitive coupling to each other and ground. Schematically, the capacitors C5–C9 are shown in FIG. 36 as C5A, C5B, C6A, C6B, C7A, C7B, C8A, C8B and C9A, C9B. The filter 30 is also configured to include one or more inductors, such as micro-inductors L3, L4, L5, L6, L7, L8 and L9, as shown in FIGS. 35–38.

A key difference between the embodiment shown in FIGS. 35–38, and the embodiment shown in FIGS. 3–5, is the implementation of proximity coupling wires $C_{56}$, $C_{67}$ and $C_{78}$. The proximity coupling wires $C_{56}$, $C_{67}$ and $C_{78}$ are connected at one end to capacitive traces C1, C2 and C3, respectively. The other ends of proximity coupling wires $C_{56}$, $C_{67}$ and $C_{78}$ hang in mid-air above the next adjacent capacitive trace, C2, C3 and C4, respectively. The distance between each proximity coupling wire and the neighboring capacitive trace can be varied to control the capacitance coupling between neighboring capacitive traces.

The filter 30 is thus tuned by controlling the distances between the proximity coupling wires, and by squeezing or stretching the inductors (shunt coils) L3, L4, L5, L6, L7, L8 and L9. The shunt coils control the frequency of the filter 30, while the series capacitive traces control the bandwidth.

Figure 37:
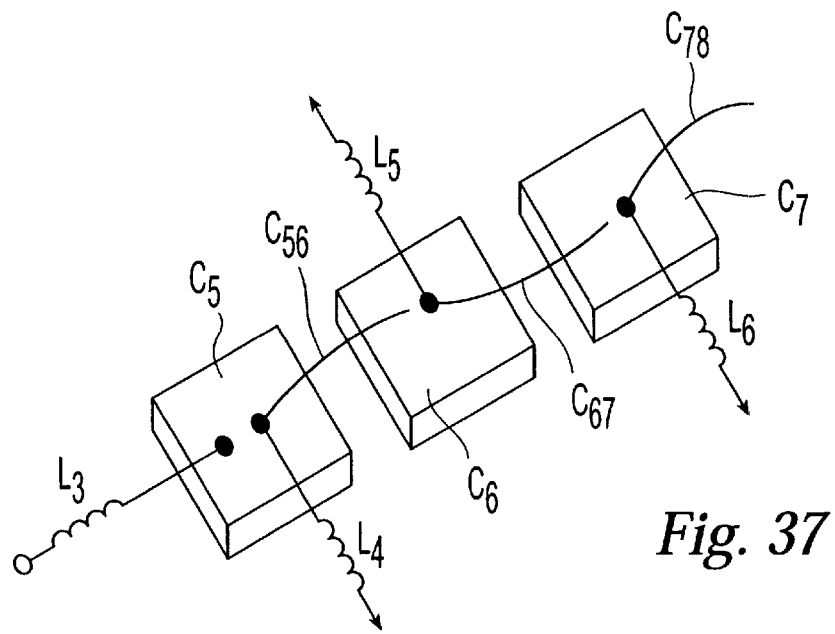
FIG. 37 is a perspective view of the embodiment shown in FIG. 35.
Figure 38:
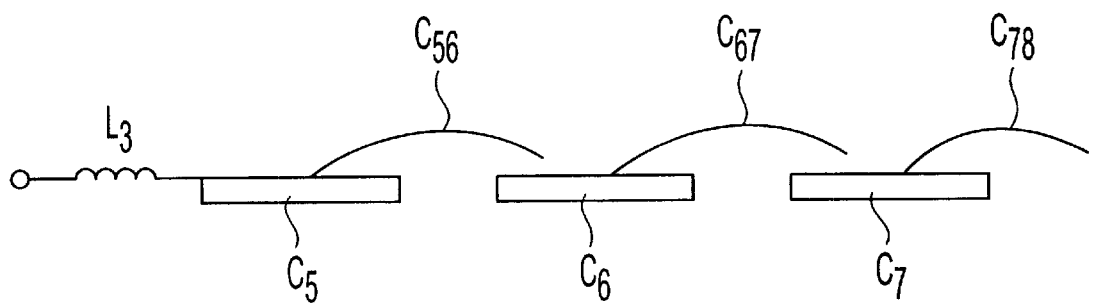
FIG. 38 is a side view of the embodiment shown in FIG. 35.

FIGS. 35, 37 and 38 show three capacitive traces C1, C2 and C3. FIG. 36 shows a schematic diagram with five capacitive traces C1, C2, C3, C4 and C5, with an additional coupling wire, represented as capacitor $C_{89}$. The number of capacitors in the filter 30 is determined by the delay that is desired. It is expected that the filter 30 will have between 3 and 7 shunts; however, the present invention is not intended to be limited to that range and greater or fewer shunts may be employed. It is expected that once the filter has been assembled and tuned, so that all of the proximity coupling wires are located the desired distance from the neighboring capacitive trace, that the unit will be encased in a housing to be employed as a pre-tuned unit, as described previously with regard to other embodiments.

Alternative Embodiment of the Low Power Delay Arrangement

Figure 39:
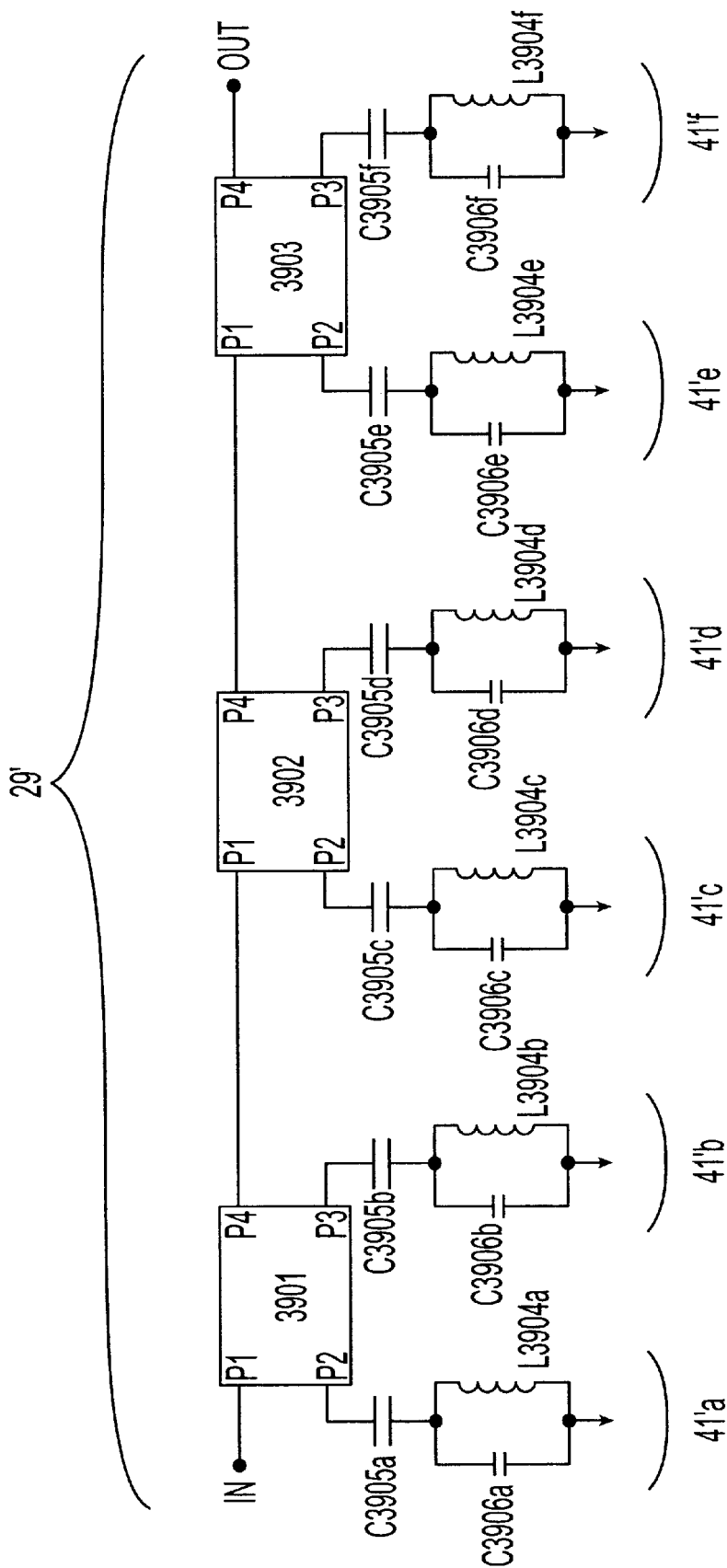
FIG. 39 shows a schematic block diagram of an alternative embodiment of a delay compensating circuit according to the present invention.

FIG. 39 shows a schematic block diagram of an alternative embodiment of a delay compensating circuit 29 according to the present invention. Delay compensating circuit 29 includes a first 3 dB quadrature hybrid coupler 3901, a second 3 dB quadrature hybrid coupler 3902, a third 3 dB quadrature hybrid coupler 3903, and a plurality of resonators 41a–41f. The input to delay compensating circuit 29 is applied to the P1 input node of coupler 3901. The P4 output node of coupler 3901 is coupled to the P1 input node of coupler 3902. The P4 output node of coupler 3902 is coupled to the P1 input node of coupler 3903. The output of delay compensating circuit 29 is appears at output node P4 of coupler 3903. Each 3 dB quadrature hybrid coupler 3901–3903 has a resonator 41 coupled to each of the P2 and P3 nodes. Each resonator 41 includes a micro inductor L3904, a capacitor C3905 and a capacitor C3906. Details regarding preferred embodiments of the 3 dB hybrid couplers for delay compensating circuit 29 are set forth in connection with FIGS. 2–5, 7, 11, 12A and 12B.

Referring to FIG. 7, each 3 dB quadrature hybrid couplers forming the respective stages of delay circuit 29N produces a delay pattern that resembles an inverted parabola shape (curve B in FIG. 7) within a narrow band of frequencies. The parabolic delay response can be designed to be "tall and narrow", or "short and wide" so to speak. By choosing the delay parabolic response of each respective stage of delay circuit 29N to be "short and wide", the edges of the parabola are substantially straight lines and the cap region has an exceedingly smooth curvature. If a minimum of three 3 dB quadrature hybrid coupler stages are cascaded, the two outer-most parabolic delay responses complement the middle parabolic delay response and the added result is a flat delay response that is sufficiently flat that for some applications the filter coupler assembly can be omitted.

Figure 40:
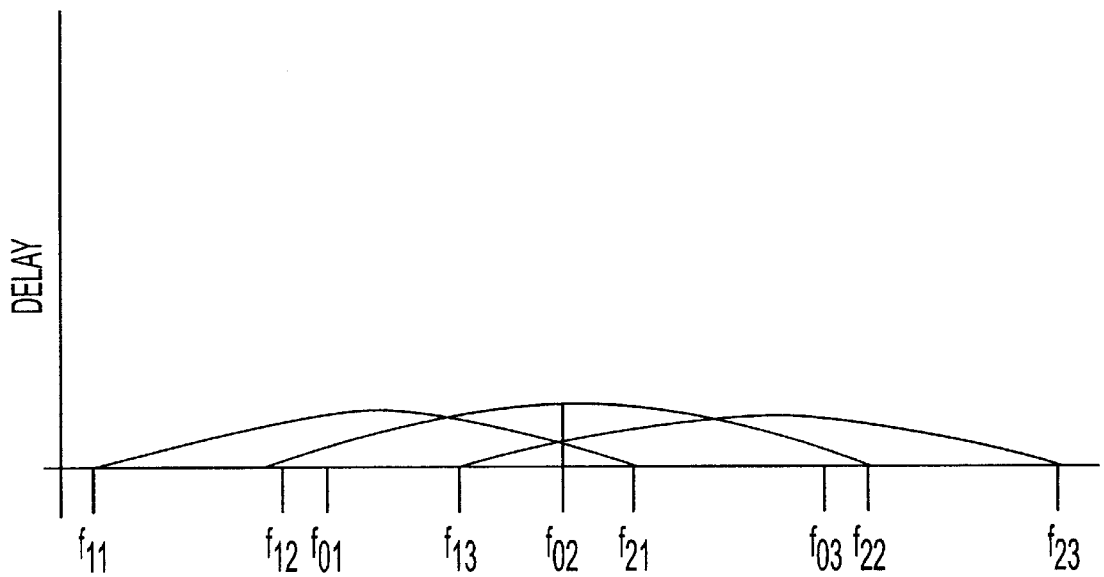
FIG. 40 shows the individual delays as a function of frequency for the respective 3 dB hybrid couplers used in the alternative embodiment shown in FIG. 39.
Figure 41:
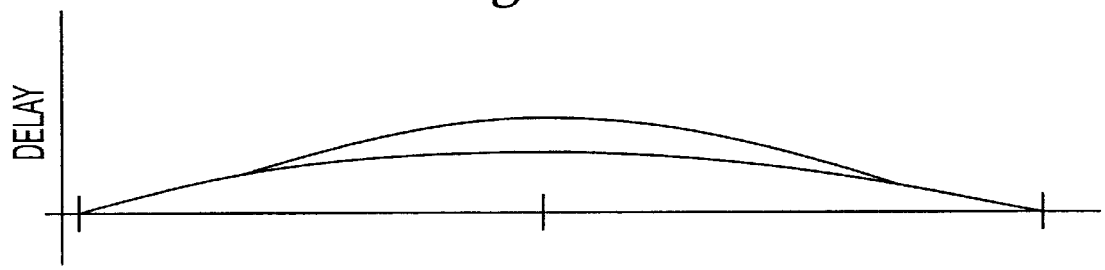
FIG. 41 shows the superposition of the individual delays as a function of frequency for the respective 3 dB hybrid couplers used in the alternative embodiment shown in FIG. 39.

FIG. 40 shows the individual delays as a function of frequency for the respective 3 dB hybrid couplers 3901–3903. In FIG. 40, curve A represents the delay as a function of frequency for 3 dB hybrid coupler 3901. Frequency $f_{01}$ is the center resonant frequency for resonators 41a and 41b. Frequency $f_{11}$ is the lower 3 dB frequency for resonators 41a and 41b, and frequency $f_{21}$ is the upper 3 dB frequency for resonators 41a and 41b. Curve B represents the delay as a function of frequency for 3 dB hybrid coupler 3902. Frequency $f_{02}$ is the center resonant frequency for resonators 41c and 41d. Frequency $f_{12}$ is the lower 3 dB frequency for resonators 41c and 41d, and frequency $f_{22}$ is the upper 3 dB frequency for resonators 41c and 41d. Curve C represents the delay as a function of frequency for 3 dB hybrid coupler 3903. Likewise, frequency $f_{03}$ is the center resonant frequency for resonators 41e and 41f. Frequency $f_{13}$ is the lower 3 dB frequency for resonators 41e and 41f, and frequency $f_{23}$ is the upper 3 dB frequency for resonators 41e and 41f. Curve D, shown in FIG. 41, represents the superposition of the individual delays as a function of frequency for the respective 3 dB hybrid couplers 3901–3903.

Of course, the lower the delay (i.e., <10 ns) provided by the cascaded coupler stages over a narrow frequency band (i.e., <10%), the more likely that an arrangement of at least three cascaded coupler stages can permit a filter coupler assembly to be omitted.

Again referring to FIG. 39, consider the arrangement when the middle frequency 3 dB hybrid coupler, i.e., coupler 3902, is removed so that the two 3 dB hybrid couplers situated below and above the frequency band of interest remain. The upper edge of the delay response curve for the lower frequency coupler and the lower edge of the delay response curve for the higher frequency coupler will be two straight lines crossing each other at the center of the frequency band of interest. The two delay response curves are substantially linear and their sum is a straight line, such that the level of the combined delay response curves at mid of band is twice the level of the delay at the cross over point. When a varactor is used in a resonator 41 instead of a capacitor C3906, the center frequency of the parabolas (FIG. 7) can be controlled.

Figure 42:
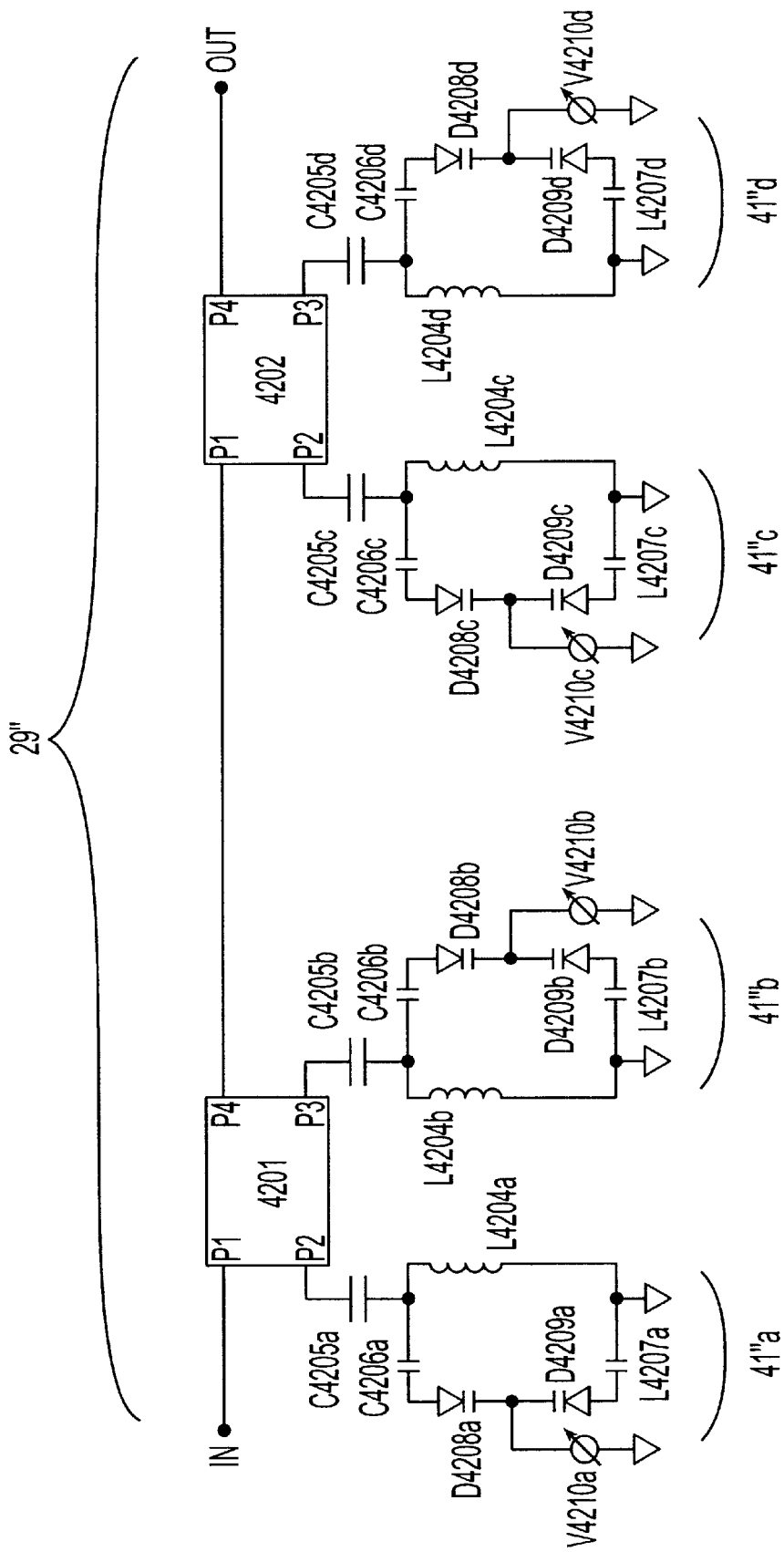
FIG. 42 shows a schematic block diagram of another alternative embodiment of a delay compensating circuit utilizing two 3 dB hybrid couplers according to the present invention.
Figure 43:
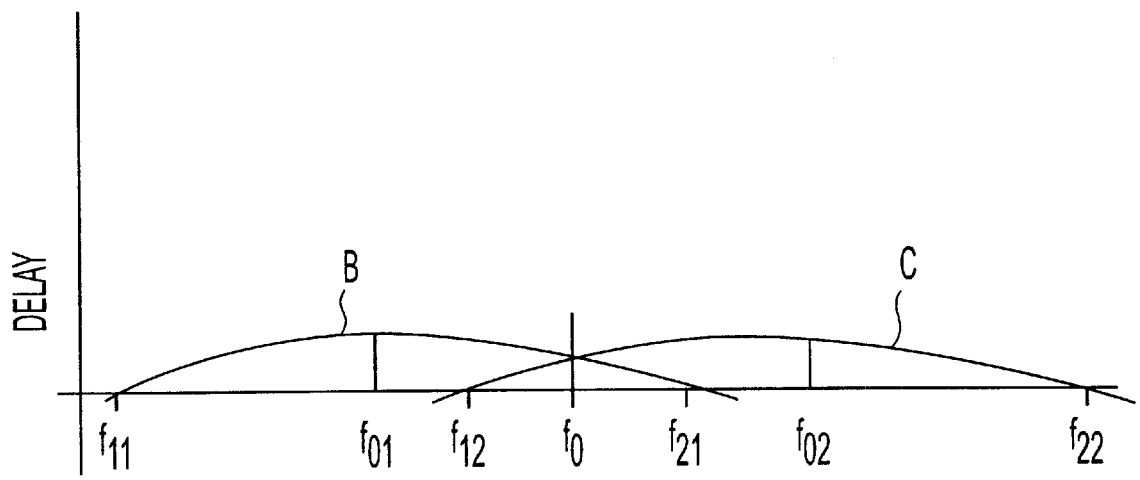
FIG. 43 shows the individual delays as a function of frequency for the respective 3 dB hybrid couplers utilized for delay compensating circuit shown in FIG. 42.
Figure 44:
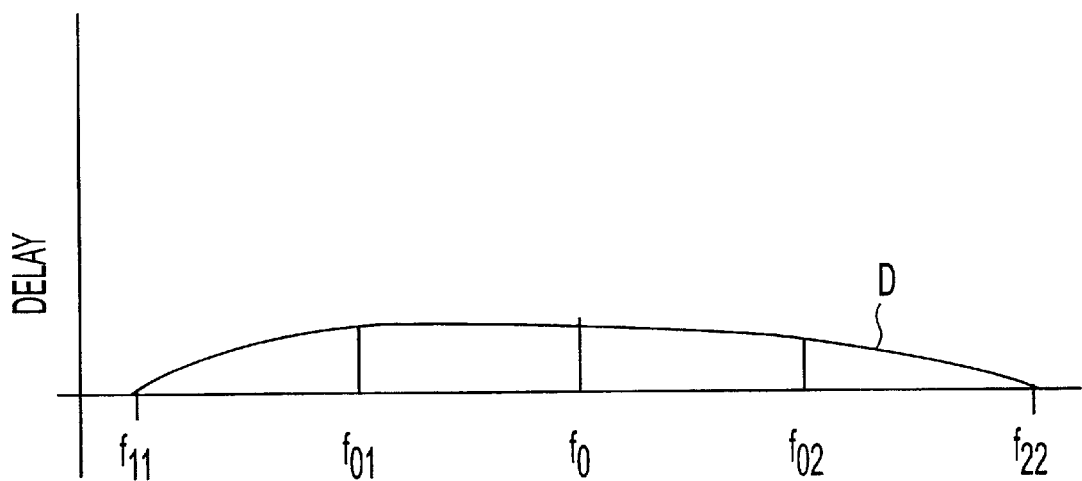
FIG. 44 shows the superposition of the individual delays as a function of frequency for the respective 3 dB hybrid couplers used in the alternative embodiment shown in FIG. 42.

FIG. 42 shows a schematic block diagram of another alternative embodiment of a delay compensating circuit 29 utilizing two 3 dB hybrid couplers according to the present invention. FIG. 43 shows the individual delays as a function of frequency for the respective 3 dB hybrid couplers utilized for delay compensating circuit 29. FIG. 44 shows the superposition of the individual delays as a function of frequency for the respective 3 dB hybrid couplers used in the alternative embodiment shown in FIG. 42.

FIG. 42 shows that delay compensating circuit 29 includes a first 3 dB quadrature hybrid coupler 4201, a second 3 dB quadrature hybrid coupler 4202, and a plurality of resonators 41a–41d. The input to delay compensating circuit 29 is applied to the P1 input node of coupler 4201. The P4 output node of coupler 4201 is coupled to the P1 input node of coupler 4202. The output of delay compensating circuit 29 is appears at output node P4 of coupler 4202. Each of 3 dB quadrature hybrid couplers 4201 and 4202 has a resonator 41 coupled to each of the P2 and P3 nodes. Each resonator 41 includes a micro inductor L4204, capacitors C4205–C4207, and a varactor circuit formed by varactors D4208 and D4209. Details regarding preferred embodiments of the 3 dB hybrid couplers for delay compensating circuit 29 are set forth in connection with FIGS. 2–5, 7, 11, 12A and 12B.

FIG. 43 shows the individual delays as a function of frequency for the respective 3 dB hybrid couplers 4201 and 4202. In FIG. 43, curve B represents the delay as a function of frequency for 3 dB hybrid coupler 4201. Frequency $f_{11}$ is the center resonant frequency for resonators 41a and 41b. Frequency $f_{11}$ is the lower 3 dB frequency for resonators 41a and 41b, and frequency $f_{21}$ is the upper 3 dB frequency for resonators 41a and 41b. Curve C represents the delay as a function of frequency for 3 dB hybrid coupler 4202. Likewise, frequency $f_{02}$ is the center resonant frequency for resonators 41c and 41d. Frequency $f_{12}$ is the lower 3 dB frequency for resonators 41c and 41d, and frequency $f_{22}$ is the upper 3 dB frequency for resonators 41c and 41d. Curve D, shown in FIG. 44, represents the superposition of the individual delays as a function of frequency for the respective 3 dB hybrid couplers 4201 and 4202.

By applying an appropriate voltage V4207a–4207d in a well-known manner to each of varactors V4206a–4206d, the center frequency for each 3 dB hybrid coupler 4201 and 4202 can be shifted toward or away from each other, thereby resulting in a linear change of the sum of the delay. The control can be performed manually, for example, during production, or programmable via a PROM. When a PROM is used, the delay variation can be part of a feed back loop that adapts to field operation.

I claim:

1. A delay circuit, comprising:
a first 3 dB quadrature hybrid coupler having a first node receiving an input signal, a second node that is coupled to a first resonator circuit, a third node that is coupled to a second resonator circuit and a fourth node that is an output node, the first and second resonators being resonant at a first resonant frequency, the first 3 dB quadrature hybrid coupler having a delay response as a function of frequency that is substantially linearly decreasing for increasing frequency greater than the first resonant frequency; and
a second 3 dB quadrature hybrid coupler having a first node coupled to the fourth node of the first 3 dB quadrature hybrid coupler, a second node that is coupled to a third resonator circuit, a third node that is coupled to a fourth resonator circuit, and a fourth node that is an output node, the third and fourth resonators being resonant at a second resonant frequency, the second resonant frequency being greater than the first resonant frequency, the second 3 dB quadrature hybrid coupler having a delay response as a function a frequency that is substantially linearly decreasing for increasing frequency less than the second resonant frequency, the overall combined delay response of the first 3 dB quadrature hybrid coupler and the second 3 dB quadrature hybrid coupler appearing at the fourth node of the second 3 dB quadrature hybrid coupler being substantially constant between the first resonant frequency and the second resonant frequency.

2. The delay circuit according to claim 1, wherein each of the first and second 3 dB quadrature hybrid couplers is a miniaturized 3 dB quadrature hybrid coupler.

3. The delay circuit according claim 1, further comprising a third 3 dB quadrature hybrid coupler having a first node connected to the fourth node of the first 3 dB quadrature hybrid coupler, a second node that is coupled to a fifth resonator circuit, a third node that is coupled to a sixth resonator circuit and a fourth node that is connected to the first node of the second 3 dB quadrature hybrid coupler, the fifth and sixth resonator circuits being resonant at a third resonant frequency, the third resonant frequency being greater than the first resonant frequency and less than the second resonant frequency, the overall combined delay response of the first 3 dB quadrature hybrid coupler, the second 3 dB quadrature hybrid coupler and the third 3 dB quadrature hybrid coupler appearing at the fourth node of the second 3 dB quadrature hybrid coupler being substantially less than about 10 ns between the first resonant frequency and the second resonant frequency.

4. The delay circuit according to claim 1 wherein each resonator circuit is an inductive-capacitive resonator circuit.

5. A feed-forward power amplifier, comprising:
a main signal path; and
a secondary signal path having a delay circuit comprising
a first 3 dB quadrature hybrid coupler having a first node receiving an input signal, a second node that is coupled to a first resonator circuit, a third node that is coupled to a second resonator circuit and a fourth node that is an output node, the first and second resonators being resonant at a first resonant frequency, the first 3 dB quadrature hybrid coupler having a delay response as a function of frequency that is substantially linearly decreasing for increasing frequency greater than the first resonant frequency; and
a second 3 dB quadrature hybrid coupler having a first node coupled to the fourth node of the first 3 dB quadrature hybrid coupler, a second node that is coupled to a third resonator circuit, a third node that is coupled to a fourth resonator circuit, and a fourth node that is an output node, the third and fourth resonators being resonant at a second resonant frequency, the second resonant frequency being greater than the first resonant frequency, the second 3 dB quadrature hybrid coupler having a delay response as a function a frequency that is substantially linearly decreasing for increasing frequency less than the second resonant frequency,
the overall combined delay response of the first 3 dB quadrature hybrid coupler and the second 3 dB quadrature hybrid coupler appearing at the fourth node of the second 3 dB quadrature hybrid coupler being substantially constant between the first resonant frequency and the second resonant frequency.

6. The feed-forward amplifier according to claim 5, wherein each of the first and second 3 dB quadrature hybrid couplers is a miniaturized 3 dB quadrature hybrid coupler.

7. The feed-forward amplifier according claim 5, wherein the delay circuit further comprises a third 3 dB quadrature hybrid coupler having a first node connected to the fourth node of the first 3 dB quadrature hybrid coupler, a second node that is coupled to a fifth resonator circuit, a third node that is coupled to a sixth resonator circuit and a fourth node that is connected to the first node of the second 3 dB quadrature hybrid coupler, the fifth and sixth resonator circuits being resonant at a third resonant frequency, the third resonant frequency being greater than the first resonant frequency and less than the second resonant frequency, the overall combined delay response of the first 3 dB quadrature hybrid coupler, the second 3 dB quadrature hybrid coupler and the third 3 dB quadrature hybrid coupler appearing at the fourth node of the second 3 dB quadrature hybrid coupler being substantially less than about 10 ns between the first resonant frequency and the second resonant frequency.

8. The feed-forward amplifier according to claim 5, wherein each resonator circuit is an inductive-capacitive resonator circuit.

* * * * *

UNITED STATES PATENT AND TRADEMARK OFFICE
CERTIFICATE OF CORRECTION

PATENT NO. : 6,664,869 B2
DATED : December 16, 2003
INVENTOR(S) : Rafi Hershtig

It is certified that error appears in the above-identified patent and that said Letters Patent is hereby corrected as shown below:

<u>Title page,</u>
Item [60], Related U.S. Application Data, "06/279,825" has been replaced with -- 60/279,825 --.

Signed and Sealed this

Thirteenth Day of July, 2004

JON W. DUDAS
*Acting Director of the United States Patent and Trademark Office*